(12) United States Patent
Kim et al.

(10) Patent No.: US 12,295,169 B2
(45) Date of Patent: May 6, 2025

(54) DISPLAY DEVICE AND METHOD OF MANUFACTURING THE SAME

(71) Applicant: Samsung Display Co., LTD., Yongin-si (KR)

(72) Inventors: Keun Woo Kim, Yongin-si (KR); Hye Na Kwak, Yongin-si (KR); Doo Na Kim, Yongin-si (KR); Sang Sub Kim, Yongin-si (KR); Bum Mo Sung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/607,426

(22) Filed: Mar. 16, 2024

(65) Prior Publication Data

US 2024/0332321 A1 Oct. 3, 2024

(30) Foreign Application Priority Data

Apr. 3, 2023 (KR) .................. 10-2023-0043285

(51) Int. Cl.
*H10D 86/01* (2025.01)
*G09G 3/3233* (2016.01)
*H10K 59/121* (2023.01)

(52) U.S. Cl.
CPC ....... *H10D 86/0221* (2025.01); *G09G 3/3233* (2013.01); *H10K 59/1213* (2023.02);
(Continued)

(58) Field of Classification Search
CPC .............. H01L 27/127; H10K 59/1213; G09G 3/3233; G09G 2300/0852
(Continued)

(56) References Cited

U.S. PATENT DOCUMENTS 11,164,526 B2 11/2021 Kim et al.
2007/0007535 A1* 1/2007 Tang .................. H01L 27/1214
257/E27.111
(Continued)

FOREIGN PATENT DOCUMENTS

CN 111834416 A 10/2020
KR 1020200047834 A 5/2020
(Continued)

OTHER PUBLICATIONS

Partial Extended European Search Report- European Application No. EP 24166078.6 dated Sep. 9, 2024.

*Primary Examiner* — Mark Edwards
(74) *Attorney, Agent, or Firm* — CANTOR COLBURN LLP

(57) ABSTRACT

A display device includes a light emitting element disposed on a substrate, a first transistor which controls a driving current flowing in the light emitting element, a second transistor which supplies a data voltage to a gate electrode of the first transistor, a first-third transistor and a second-third transistor connected in series between the gate and drain electrodes of the first transistor, a first charge injection layer adjacent to a drain electrode of the first-third transistor electrically connected to the gate electrode of the first transistor on a semiconductor region of the first-third transistor, and a second charge injection layer adjacent to a source electrode of the second-third transistor integrally formed with the drain electrode of the first transistor on a semiconductor region of the second-third transistor. A charge injection area of the first charge injection layer is greater than a charge injection area of the second charge injection layer.

23 Claims, 16 Drawing Sheets

(52) U.S. Cl.
CPC .............. *G09G 2300/0819* (2013.01); *G09G 2300/0852* (2013.01)

(58) Field of Classification Search
USPC ......................................... 345/214
See application file for complete search history.

(56) References Cited

U.S. PATENT DOCUMENTS

| | | | |
|---|---|---|---|
| 2020/0135831 A1* | 4/2020 | Bae ...................... | H10K 59/131 |
| 2021/0036080 A1* | 2/2021 | Kim ...................... | G09G 3/3233 |
| 2022/0254814 A1 | 8/2022 | Nishimura et al. | |
| 2022/0376117 A1 | 11/2022 | Kim | |
| 2023/0042966 A1* | 2/2023 | Huangfu .............. | G09G 3/3258 |

FOREIGN PATENT DOCUMENTS

| | | |
|---|---|---|
| KR | 1020200124365 A | 11/2020 |
| KR | 1020210113513 A | 9/2021 |

\* cited by examiner

ST1 : SE1, ACT1, GE1, DE1
ACTL : DE1, ACT1, DE1
GTL1 : GE1, CPE1
GTL2 : CPE2
SDL1 : VCE
SDL2 : DL1, VDDL, VRLa

ACTL : DE3-1, ACT3-1, SE3-1
        DE3-2, ACT3-2, SE3-2
GTL1 : GE3-1, GE3-2
GTL2 : CPE

ACTL : SE4-1, ACT4-1, DE4-1
        SE4-2, ACT4-2, DE4-2
GTL1 : GE4-1, GE4-2
GTL2 : CPE

ACTL : DE3-1, ACT3-1, SE3-1
DE3-2, ACT3-2, SE3-2

DISPLAY DEVICE AND METHOD OF MANUFACTURING THE SAME

This application claims priority to Korean Patent Application No. 10-2023-0043285, filed on Apr. 3, 2023, and all the benefits accruing therefrom under 35 U.S.C. § 119, the content of which in its entirety is herein incorporated by reference.

BACKGROUND

1. Field

The disclosure relates to a display device and a method of manufacturing the display device.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions. Among the display device, a light-emitting display device includes a light-emitting element that can emit light on its own, so that each of the pixels of the display panel can emit light by themselves. Accordingly, a light-emitting display device can display images without using a backlight unit that supplies light to the display panel.

The display device typically includes a plurality of pixels, data lines and gate lines connected to the plurality of pixels, a data driver for supplying data voltages to the data lines, and a gate driver for supplying gate signals to the gate lines. The data driver and the gate driver may drive a plurality of pixels according to a predetermined frequency.

SUMMARY

Embodiments of the disclosure provide a display device capable of stably maintaining a voltage inside a pixel by preventing a leakage current from flowing at the gate electrode of the first transistor and a manufacturing method thereof.

According to an embodiment, a display device includes a light emitting element disposed on a substrate, a first transistor which controls a driving current flowing in the light emitting element, a second transistor which supplies a data voltage to a gate electrode of the first transistor, a first-third transistor and a second-third transistor connected to each other in series between the gate electrode of the first transistor and a drain electrode of the first transistor, a first charge injection layer disposed on a semiconductor region of the first-third transistor to be adjacent to a drain electrode of the first-third transistor electrically connected to the gate electrode of the first transistor, and a second charge injection layer disposed on a semiconductor region of the second-third transistor to be adjacent to a source electrode of the second-third transistor integrally formed with the drain electrode of the first transistor as a single unitary and indivisible part. In such an embodiment, a charge injection area of the first charge injection layer is greater than a charge injection area of the second charge injection layer.

In an embodiment, a length of the semiconductor region of the first-third transistor may be shorter than a length of the semiconductor region of the second-third transistor, and a length of the first charge injection layer may be longer than a length of the second charge injection layer.

In an embodiment, the display device may further include a first initialization voltage line which supplies a first initialization voltage, a first-fourth transistor and a second-fourth transistor connected to each other in series between the gate electrode of the first transistor and the first initialization voltage line, a third charge injection layer disposed on a semiconductor region of the first-fourth transistor to be adjacent to a source electrode of the first-fourth transistor electrically connected to the gate electrode of the first transistor, and a fourth charge injection layer disposed on a semiconductor region of the second-fourth transistor to be adjacent to a drain electrode of the second-fourth transistor electrically connected to the first initialization voltage line.

In an embodiment, a charge injection area of the third charge injection layer may be greater than a charge injection area of the fourth charge injection layer.

In an embodiment, a length of the semiconductor region of the first-fourth transistor may be shorter than a length of the semiconductor region of the second-fourth transistor, and a length of the third charge injection layer may be longer than a length of the fourth charge injection layer.

In an embodiment, the display device may further include a driving voltage line which supplies a driving voltage, a first capacitor including a first capacitor electrode electrically connected to the gate electrode of the first transistor and a second capacitor electrode electrically connected to the second transistor, and a second capacitor including a third capacitor electrode electrically connected to the second capacitor electrode and a fourth capacitor electrode electrically connected to the driving voltage line.

In an embodiment, the display device may further include a capacitor electrode overlapping a source electrode of the first-third transistor and a drain electrode of the second-third transistor, and a third capacitor formed between the source electrode of the first-third transistor and the capacitor electrode.

In an embodiment, the display device may further include a capacitor electrode overlapping a drain electrode of the first-fourth transistor and a source electrode of the second-fourth transistor, and a fourth capacitor formed between the drain electrode of the first-fourth transistor and the capacitor electrode.

In an embodiment, the display device may further include a reference voltage line which supplies a reference voltage, and a first-fifth transistor and a second-fifth transistor connected to each other in series between the second capacitor electrode and the reference voltage line.

In an embodiment, the display device may further include a second initialization voltage line which supplies a second initialization voltage, a bias voltage line which supplies a bias voltage, a sixth transistor electrically connected between the drain electrode of the first transistor and a first electrode of the light emitting element, a seventh transistor electrically connected between the first electrode of the light emitting element and the second initialization voltage line, an eighth transistor electrically connected between the bias voltage line and a source electrode of the first transistor, and a ninth transistor electrically connected between the driving voltage line and the source electrode of the first transistor.

In an embodiment, the semiconductor region of the second-third transistor may have a trapezoidal shape.

In an embodiment, the semiconductor region of the second-third transistor may include a first side extending to a first direction and having a first length, a second side extending in parallel to the first side and having a second length greater than the first length, a third side extending in a second direction perpendicular to the first direction between one side of the first side and one side of the second side, and a fourth side extending in a diagonal direction between the first direction and the second direction from an opposing side of the first side to an opposing side of the second side.

According to an embodiment, a display device includes a light emitting element disposed on a substrate, a first transistor which controls a driving current flowing in the light emitting element, a second transistor which supplies a data voltage to a gate electrode of the first transistor, a first-third transistor and a second-third transistor connected to each other in series between the gate electrode of the first transistor and a drain electrode of the first transistor, a first charge injection layer disposed on a semiconductor region of the first-third transistor to be adjacent to a drain electrode of the first-third transistor, a second charge injection layer disposed on a semiconductor region of the second-third transistor to be adjacent to a source electrode of the second-third transistor, a first initialization voltage line which supplies a first initialization voltage, a first-fourth transistor and a second-fourth transistor connected to each other in series between the gate electrode of the first transistor and the first initialization voltage line, a third charge injection layer disposed on a semiconductor region of the first-fourth transistor to be adjacent to a source electrode of the first-fourth transistor, and a fourth charge injection layer disposed on a semiconductor region of the second-fourth transistor to be adjacent to a drain electrode of the second-fourth transistor.

In an embodiment, a length of the semiconductor region of the first-third transistor may be shorter than a length of the semiconductor region of the second-third transistor, and a length of the first charge injection layer may be longer than a length of the second charge injection layer.

In an embodiment, a length of the semiconductor region of the first-fourth transistor may be shorter than a length of the semiconductor region of the second-fourth transistor, and a length of the third charge injection layer may be longer than a length of the fourth charge injection layer.

According to an embodiment, a display device includes a light emitting element disposed on a substrate, a first transistor which controls a driving current flowing in the light emitting element, a second transistor which supplies a data voltage to a gate electrode of the first transistor, and a first-third transistor and a second-third transistor connected to each other in series between the gate electrode of the first transistor and a drain electrode of the first transistor. In such an embodiment, a semiconductor region of the second-third transistor includes a first side extending in a first direction and having a first length, a second side extending in parallel to the first side and having a second length greater than the first length, a third side extending in a second direction perpendicular to the first direction between one side of the first side and one side of the second side, and a fourth side extending in a diagonal direction between the first direction and the second direction from an opposing side of the first side to an opposing side of the second side.

In an embodiment, the display device may further include a first charge injection layer disposed on a semiconductor region of the first-third transistor to be adjacent to a drain electrode of the first-third transistor electrically connected to the gate electrode of the first transistor, and a second charge injection layer disposed on a semiconductor region of the second-third transistor to be adjacent to a source electrode of the second-third transistor integrally formed with the drain electrode of the first transistor as a single unitary and indivisible part.

In an embodiment, a length of the semiconductor region of the first-third transistor may be shorter than a length of the semiconductor region of the second-third transistor, and a length of the first charge injection layer may be longer than a length of the second charge injection layer.

According to an embodiment, a method of manufacturing a display device includes forming a semiconductor region, a source electrode, and a drain electrode of each of a first transistor, a second transistor, a first-third transistor, and a second-third transistor on a substrate, doping a first ion energy on a portion of the semiconductor region of the first-third transistor adjacent to the drain electrode of the first-third transistor, doping a second ion energy weaker than the first ion energy on a portion of the semiconductor region of the second-third transistor adjacent to the source electrode of the second-third transistor, and forming a gate electrode of each of the first transistor, the second transistor, the first-third transistor, and the second-third transistor. In such an embodiment, the second transistor is electrically connected to the gate electrode of the first transistor, and the first-third transistor and second-third transistor are connected to each other in series between the gate electrode of the first transistor and the drain electrode of the first transistor.

In an embodiment, the doping the first ion energy may include doping ion energy on the portion of the semiconductor region of the first-third transistor using a hard mask or a photoresist.

In the display device and the method of manufacturing the display device according to embodiments, the leakage current flowing in a first-third transistor and a second-third transistor may be reduced and a threshold voltage shift may be reduced by differentially injecting charges into the first-third transistor and the second-third transistor. Accordingly, in such embodiments, the display device and the method of manufacturing the display device may effectively prevent leakage current from flowing in the gate electrode of the first transistor and stably maintain a voltage inside the pixel.

However, the effects of the disclosure are not limited to the aforementioned effects, and various other effects are included in the disclosure.

BRIEF DESCRIPTION OF THE DRAWINGS

The above and other features of embodiments of the disclosure will become more apparent by describing in detail embodiments thereof with reference to the accompanying drawings, in which.

DETAILED DESCRIPTION

Figure 1:
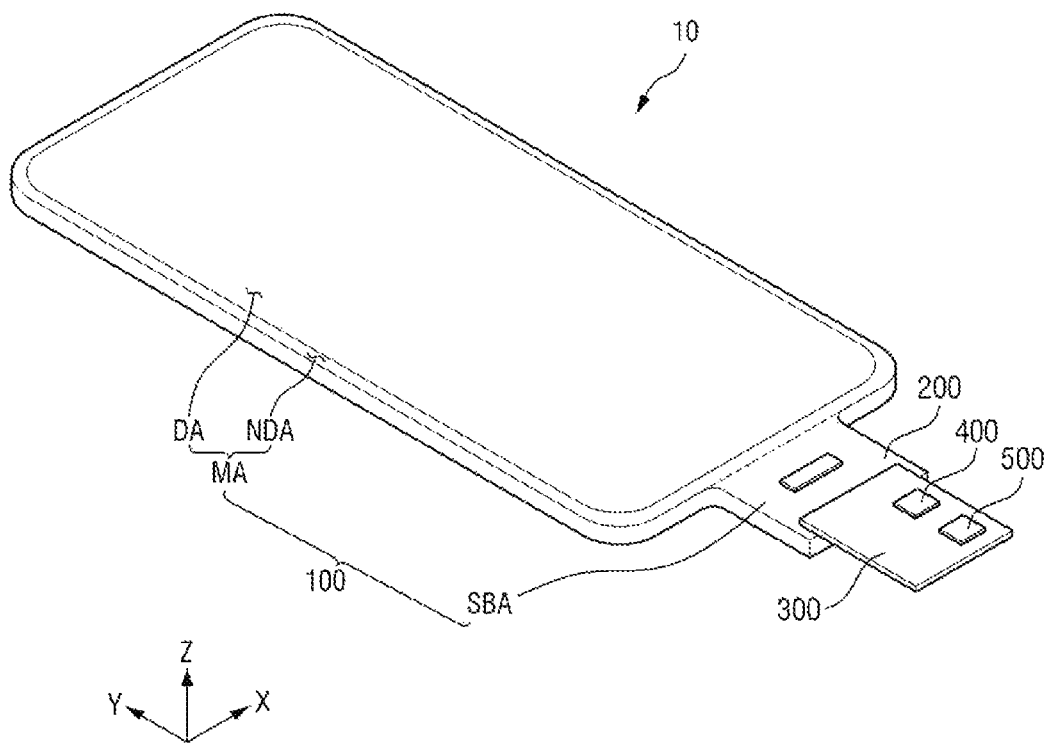
FIG. 1 is a perspective view showing a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, ZZ, or the like. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a" "an," and "the" are intended to include both the singular and plural, unless the context clearly indicates otherwise. "At least one" is not to be construed as limiting "a" or "an." "Or" means "and/or." As used herein, the term "and/or" includes any and all combinations of one or more of the associated listed items. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described in detail with reference to the accompanying drawings.

FIG. 1 is a perspective view showing a display device according to an embodiment.

Referring to FIG. 1, an embodiment of a display device 10 may be employed by portable electronic devices such as a mobile phone, a smart phone, a tablet personal computer (PC), a mobile communications terminal, an electronic notebook, an electronic book, a portable multimedia player (PMP), a navigation device and an ultra mobile PC (UMPC). In an embodiment, for example, the display device 10 may be used as a display unit of a television, a laptop computer, a monitor, an electronic billboard, or the Internet of Things (IOT). In an alternative embodiment, for another example, the display device 10 may be applied to wearable devices such as a smart watch, a watch phone, a glasses-type display, and a head-mounted display (HMD) device.

The display device 10 may have a shape similarly to a quadrangular shape when viewed from the top. In an embodiment, for example, the display device 10 may have a shape similar to a quadrangle having shorter sides in the X-axis direction and longer sides in the Y-axis direction when viewed from a top plan view or when viewed in a thickness direction (Z-axis direction). The corners where the shorter sides in the X-axis direction and the longer sides in the Y-axis direction meet may be rounded to have a predetermined curvature or may be formed at a right angle. The shape of the display device 10 when viewed from the top plan view is not limited to a quadrangular shape, but may be formed in a shape similar to other polygonal shapes, a circular shape, or an elliptical shape.

The display device 10 may include a display panel 100, a display driver 200, a circuit board 300, a touch driver 400, and a power supply unit 500.

The display panel 100 may include a main area MA and a subsidiary area SBA.

The main area MA may include a display area DA including pixels for displaying images, and a non-display area NDA located around the display area DA. The display area DA may emit light from a plurality of emission areas or a plurality of opening areas. In an embodiment, for example, the display panel 100 may include a pixel circuit including switching elements, a pixel defining layer that defines the emission areas or the opening areas, and a self-light-emitting element.

In an embodiment, for example, the self-light-emitting element may include, but is not limited to, at least one of: an organic light-emitting diode including an organic emissive layer, a quantum-dot light-emitting diode (quantum LED) including a quantum-dot emissive layer, an inorganic light-emitting diode (inorganic LED) including an inorganic semiconductor, and a micro light-emitting diode (micro LED).

The non-display area NDA may be disposed on the outer side of the display area DA. The non-display area NDA may be defined as the edge area of the main area MA of the display panel 100. The non-display area NDA may include a gate driver (not shown) that applies gate signals to gate lines, and fan-out lines (not shown) that connect the display driver 200 with the display area DA.

The subsidiary area SBA may be extended from one side of the main area MA. The subsidiary area SUB may include a flexible material that can be bent, folded, or rolled. In an embodiment, for example, when the subsidiary area SBA is bent, the subsidiary area SBA may overlap the main area MA in the thickness direction (Z-axis direction). The subsidiary area SBA may include pads connected to the display driver 200 and the circuit board 300. Alternatively, the subsidiary area SBA may be omitted, and the display driver 200 and the pads may be disposed in the non-display area NDA.

The display driver 200 may output signals and voltages for driving the display panel 100. The display driver 200 may supply data voltages to data lines. The display driver 200 may apply a power voltage to a power line and may supply gate control signals to the gate driver. The display driver 200 may be implemented as an integrated circuit (IC) and may be attached on the display panel 100 by a chip-on-glass (COG) technique, a chip-on-plastic (COP) technique, or ultrasonic bonding. In an embodiment, for example, the display driver 200 may be disposed in the subsidiary area SBA and may overlap the main area MA in the thickness direction (Z-axis direction) when the subsidiary area SBA is bent. In an alternative embodiment, for example, the display driver 200 may be mounted on the circuit board 300.

The circuit board 300 may be attached on the pads of the display panel 100 using an anisotropic conductive film (ACF). Lead lines of the circuit board 300 may be electrically connected to the pads of the display panel 100. The circuit board 300 may be a flexible printed circuit board (FPCB), a printed circuit board (PCB), or a flexible film such as a chip-on-film (COF).

The touch driver 400 may be mounted on the circuit board 300. The touch driver 400 may be electrically connected to a touch sensing unit of the display panel 100. The touch driver 400 may supply a touch driving signal to a plurality of touch electrodes of the touch sensing unit and may sense a change in the capacitance between the plurality of touch electrodes. In an embodiment, for example, the touch driving signal may be a pulse signal having a predetermined frequency. The touch driver 400 may determine whether there is an input and may find the coordinates of the input based on the amount of the change in the capacitance between the touch electrodes. The touch driver 400 may be implemented as an integrated circuit (IC).

The power supply unit 500 may be disposed on the circuit board 300 to apply a power voltage to the display drivers 200 and the display panel 100. The power supply unit 500 may generate a driving voltage to provide the driving voltage to a driving voltage line, and may generate a common voltage and supply the common voltage to a common electrode common to light emitting elements of a plurality of pixels. In an embodiment, for example, the driving voltage may be a high-level voltage for driving the light emitting element, and the common voltage may be a low-level voltage for driving the light emitting element. The power supply unit 500 may generate initialization voltages to provide initialization voltages to initialization voltage lines, may generate reference voltages to provide the reference voltages to reference voltage lines, and may generate bias voltages to provide the bias voltages to bias voltage lines.

Figure 2:
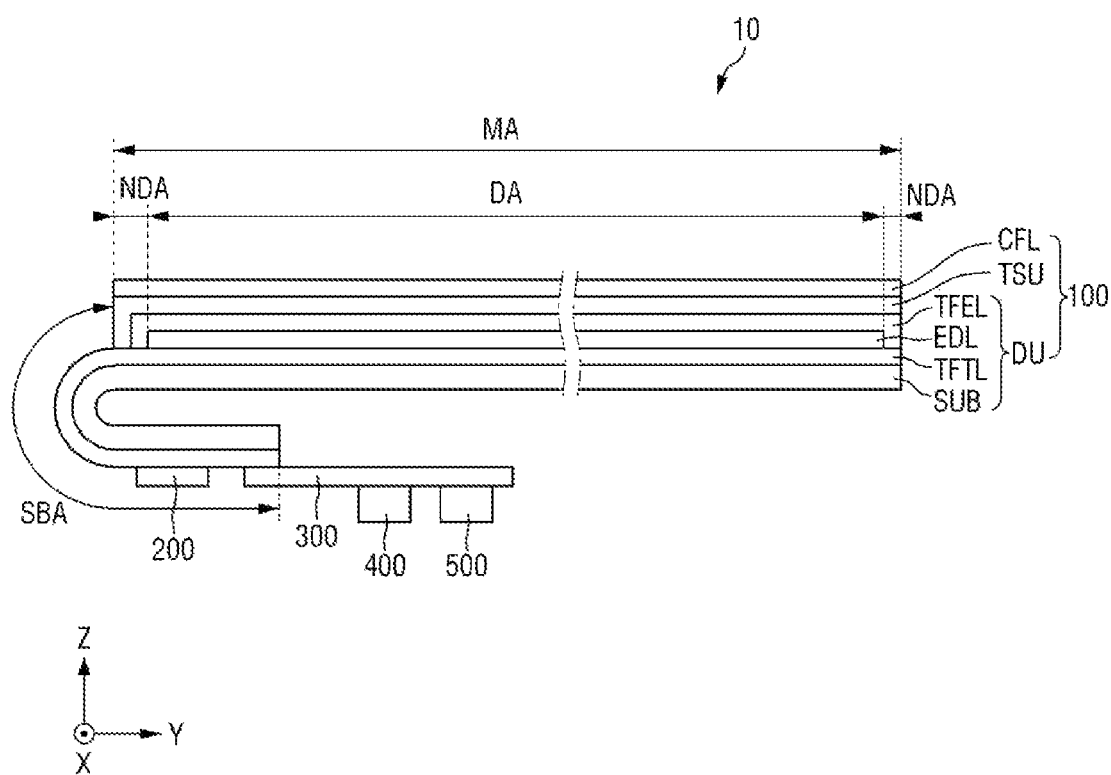
FIG. 2 is a cross-sectional view showing a display device according to an embodiment.

FIG. 2 is a cross-sectional view showing a display device according to an embodiment.

Referring to FIG. 2, an embodiment of the display panel 100 may include a display unit DU, a touch sensing unit TSU, and a color filter layer CFL. The display unit DU may include a substrate SUB, a thin-film transistor layer TFTL, a light emitting element layer EDL and an encapsulation layer TFEL.

The substrate SUB may be a base substrate or a base member. The substrate SUB may be a flexible substrate that can be bent, folded, or rolled. In an embodiment, for example, the substrate SUB may include, but is not limited to, a polymer resin such as polyimide (PI). In an alternative embodiment, for example, the substrate SUB may include a glass material or a metal material.

The thin-film transistor layer TFTL may be disposed on the substrate SUB. The thin-film transistor layer TFTL may include a plurality of thin-film transistors forming pixel circuits of pixels. The thin-film transistor layer TFTL may include gate lines, data lines, power lines, gate control lines, fan-out lines for connecting the display driver 200 with the data lines, lead lines for connecting the display driver 200 with the pads, etc. Each of the thin-film transistors may include a semiconductor region, a source electrode, a drain electrode, and a gate electrode. In an embodiment, for example, where the gate driver is formed on one side of the non-display area NDA of the display panel 100, the gate driver may include thin-film transistors.

The thin-film transistor layer TFTL may be disposed in the display area DA, the non-display area NDA and the subsidiary area SBA. The thin-film transistors in each of the pixels, the gate lines, the data lines and the power lines in the thin-film transistor layer TFTL may be disposed in the display area DA. The gate control lines and the fan-out lines in the thin-film transistor layer TFTL may be disposed in the non-display area NDA. The lead lines of the thin-film transistor layer TFTL may be disposed in the subsidiary area SBA.

The light emitting element layer EDL may be disposed on the thin-film transistor layer TFTL. The light emitting element layer EDL may include a plurality of light emitting elements in each of which a pixel electrode, a light emitting layer and a common electrode are stacked on one another sequentially to emit light, and a pixel defining layer for defining the pixels. The plurality of light emitting elements in the light emitting element layer EDL may be disposed in the display area DA.

In an embodiment, for example, the light emitting layer may be an organic light emitting layer containing an organic material. The light emitting layer may include a hole transporting layer, an organic light emitting layer and an electron transporting layer. When the pixel electrode receives a predetermined voltage and the common electrode receives a cathode voltage through the thin-film transistors in the thin-film transistor layer TFTL, the holes and electrons may move to the organic light emitting layer through the hole transporting layer and the electron transporting layer, respectively, such that they combine in the organic light emitting layer to emit light. In an embodiment, for example, the pixel electrode may be an anode electrode while the common electrode may be a cathode electrode.

In an alternative embodiment, for example, the light emitting elements may include quantum-dot light emitting diodes each including a quantum-dot light emitting layer, inorganic light emitting diodes each including an inorganic semiconductor, or micro light emitting diodes.

The encapsulation layer TFEL may cover the upper and side surfaces of the light emitting element layer EDL, and can protect the light emitting element layer EDL. The encapsulation layer TFEL may include at least one inorganic layer and at least one organic layer for encapsulating the light emitting element layer EDL.

The touch sensing unit TSU may be disposed on the encapsulation layer TFEL. The touch sensing unit TSU may include a plurality of touch electrodes for sensing a user's touch by capacitive sensing, and touch lines connecting the plurality of touch electrodes with the touch driver 400. A plurality of touch electrodes of the touch sensing unit TSU may be disposed in a touch sensor area overlapping the display area DA. The touch lines of the touch sensing unit TSU may be disposed in a touch peripheral area overlapping the non-display area NDA. In an embodiment, for example, the touch sensing unit TSU may sense a user's touch by mutual capacitance sensing or self-capacitance sensing.

In an alternative embodiment, for example, the touch sensing unit TSU may be disposed on a separate substrate disposed on the display unit DU. In such an embodiment, the substrate supporting the touch sensing unit TSU may be a base member encapsulating the display unit DU.

The color filter layer CFL may be disposed on the touch sensing unit TSU. The color filter layer CFL may include a plurality of color filters associated with the plurality of emission areas, respectively. Each of the color filters may selectively transmit light of a particular wavelength and block or absorb lights of other wavelengths. The color filter layer CFL may absorb some of lights introduced from the outside of the display device 10 to reduce the reflection of external light. Accordingly, the color filter layer CFL can prevent distortion of colors due to the reflection of external light.

In such an embodiment where the color filter layer CFL is disposed directly on the touch sensing unit TSU, the display device 10 may not include a separate substrate for the color filter layer CFL. Therefore, the thickness of the display device 10 can be relatively reduced.

The subsidiary area SBA of the display panel 100 may be extended from one side of the main area MA. The subsidiary area SUB may include a flexible material that can be bent, folded, or rolled. In an embodiment, for example, when the subsidiary area SBA is bent, the subsidiary area SBA may overlap the main area MA in the thickness direction (Z-axis direction). The subsidiary area SBA may include pads electrically connected to the display driver 200 and the circuit board 300.

Figure 3:
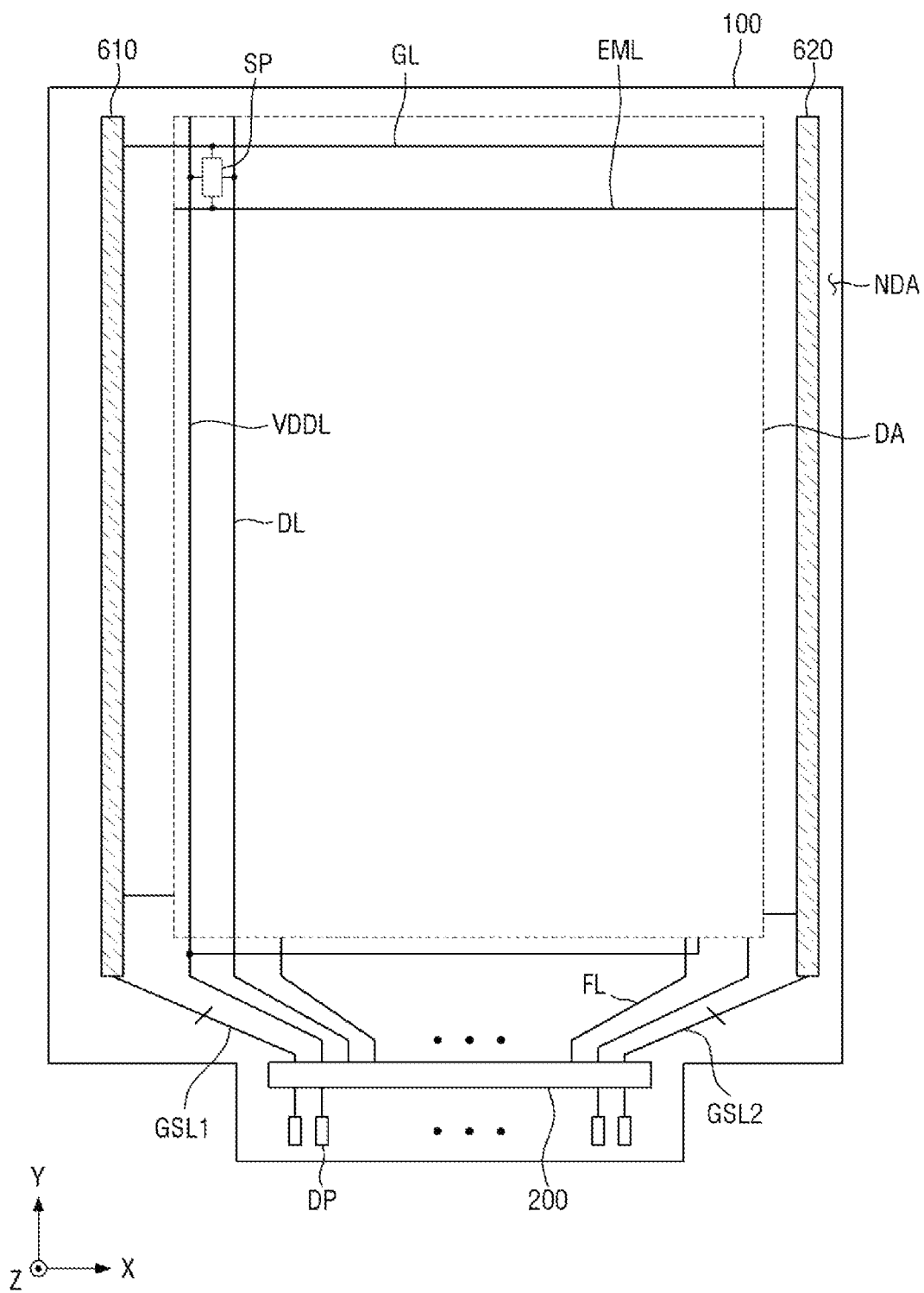
FIG. 3 is a plan view showing a display unit of a display device according to an embodiment.
Figure 4:
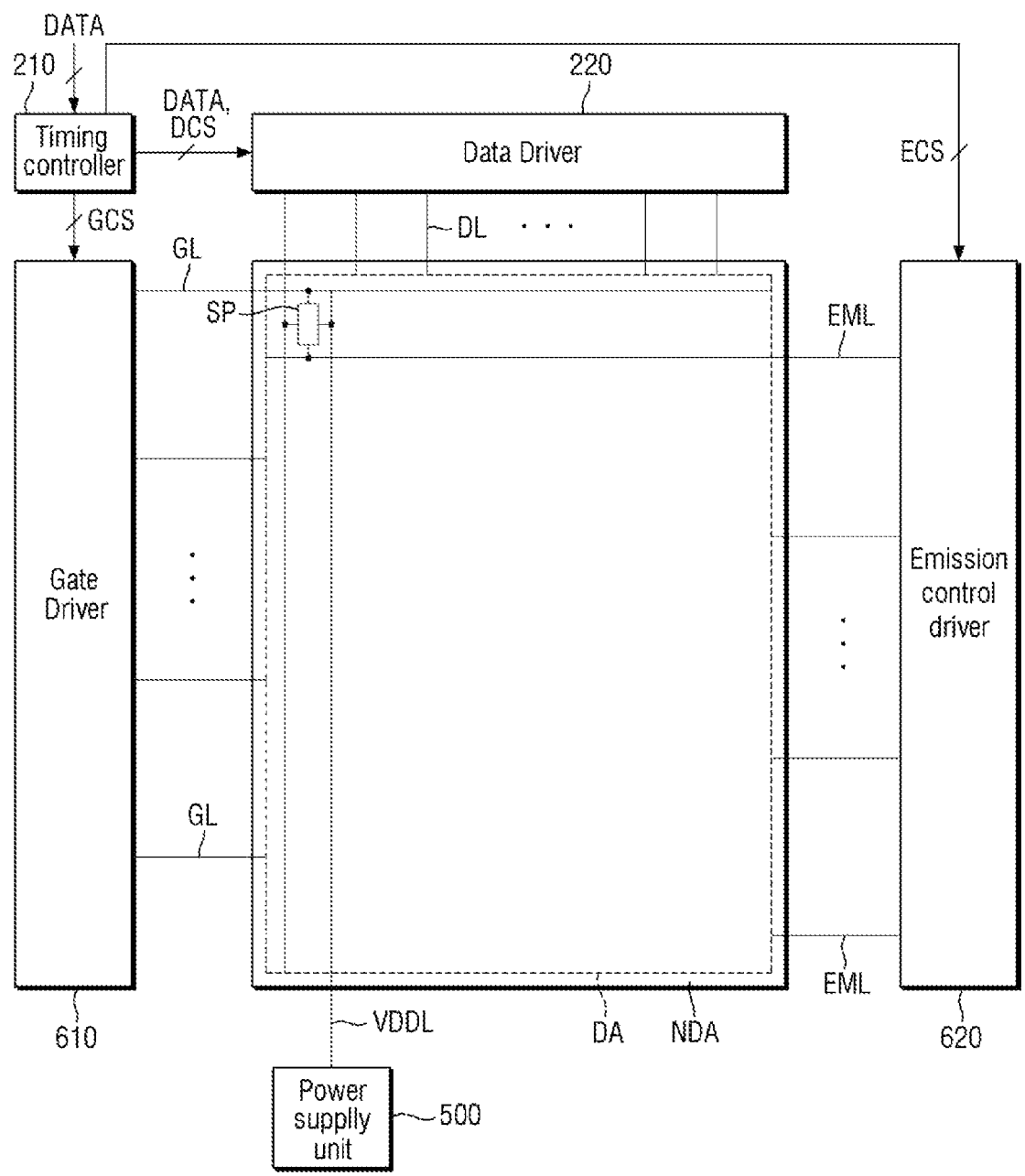
FIG. 4 is a block diagram illustrating a display panel and a display driver according to an embodiment.

FIG. 3 is a plan view showing a display unit of a display device according to an embodiment. FIG. 4 is a block diagram illustrating a display panel and a display driver according to an embodiment.

Referring to FIGS. 3 and 4, an embodiment of the display panel 100 may include the display area DA and the non-display area NDA. The display area DA may include pixels SP, driving voltage lines VDDL, gate lines GL, emission control lines EML, and data lines DL.

Each of the plurality of pixels SP may be connected to a gate line GL, a data line DL, an emission control line EML, and a driving voltage line VDDL. Each of the plurality of pixels SP may include at least one transistor, a light emitting element, and a capacitor.

The gate lines GL may extend in the X-axis direction and may be spaced apart from one another in the y-axis direction crossing the X-axis direction. The gate lines GL may sequentially supply gate signals to the plurality of pixels SP.

The emission control lines EML may extend in the x-axis direction and may be spaced apart from one another in the Y-axis direction. The emission control lines EML may sequentially supply emission signals to the plurality of pixels SP.

The data lines DL may extend in the y-axis direction and may be spaced apart from one another in the X-axis direction. The data lines DL may supply data voltages to the plurality of pixels SP. The data voltage may determine luminance of each of the plurality of pixels SP.

The driving voltage lines VDDL may extend in the Y-axis direction and may be spaced apart from one another in the X-axis direction. The driving voltage lines VDDL may supply driving voltages to the plurality of pixels SP. The driving voltage may be a high-level voltage for driving light emitting elements of the pixels SP.

The non-display area NDA may surround the display area DA. The non-display area NDA may include a gate driver 610, an emission control driver 620, fan-out lines FL, a first gate control line GSL1 and a second gate control line GSL2.

The fan-out lines FL may extend from the display driver 200 to the display area DA. The fan-out lines FL may supply the data voltage received from the display driver 200 to the plurality of data lines DL.

The first gate control line GSL1 may extend from the display driver 200 to the gate driver 610. The first gate control line GSL1 may supply the gate control signal GCS received from the display driver 200 to the gate driver 610.

The second gate control line GSL2 may extend from the display driver 200 to the emission control driver 620. The second gate control line GSL2 may supply the emission control signal ECS received from the display driver 200 to the emission control driver 620.

The subsidiary area SBA may extend from one side of the non-display area NDA. The subsidiary area SBA may include the display driver 200 and pads DP. The pads DP may be disposed closer to one edge of the subsidiary area SBA than the display driver 200. The pads DP may be electrically connected to the circuit board 300 through an ACF.

In an embodiment, as shown in FIG. 4, the display driver 200 may include a timing controller 210 and a data driver 220.

The timing controller 210 may receive digital video data DATA and timing signals from the circuit board 300. The timing controller 210 may generate a data control signal DCS to control the operation timing of the data driver 220, may generate a gate control signal GCS to control the operation timing of the gate driver 610, and may generate an emission control signal ECS to control the operation timing of the emission control driver 620 based on the timing signals. The timing controller 210 may supply the gate control signal GCS to the gate driver 610 through the first gate control line GSL1. The timing controller 210 may supply the emission control signal ECS to the emission control driver 620 through the second gate control line GSL2. The timing controller 210 may supply the digital video data DATA and the data control signal DCS to the data driver 220.

The data driver 220 may convert the digital video data DATA into analog data voltages and may supply the analog data voltages to the data lines DL through the fan-out lines FL. The gate signals from the gate driver 610 may be used to select pixels SP to which a data voltage is applied, and the selected pixels SP may receive the data voltage through the data lines DL.

The power supply unit 500 may be disposed on the circuit board 300 to supply power voltage to the display drivers 200 and the display panel 100. The power supply unit 500 may generate a driving voltage to supply the driving voltage to a driving voltage line VDDL, and may generate a common voltage to supply the common voltage to a common electrode shared by the light emitting elements of a plurality of pixels SP. The power supply unit 500 may generate initialization voltages to provide the initialization voltages to initialization voltage lines, may generate reference voltages to provide the reference voltages to reference voltage lines, and may generate bias voltages to provide the bias voltages to bias voltage lines.

The gate driver 610 may be disposed on one outer side of the display area DA or on one outer side of the non-display area NDA, and the emission control driver 620 may be disposed on the opposite outer side of the display area DA or on the opposite outer side of the non-display area NDA. It should be understood, however, that the disclosure is not limited thereto. In an alternative embodiment, for example, the gate driver 610 and the emission control driver 620 may be disposed on one side or an opposing side of the non-display area NDA.

The gate driver 610 may include a plurality of thin-film transistors for generating gate signals based on the gate control signal GCS. The emission control driver 620 may include a plurality of thin-film transistors for generating emission signals based on the emission control signal ECS. In an embodiment, for example, the transistors of the gate driver 610 and the transistors of the emission control driver 620 may be formed in (or directly on) a same layer as the transistors of each of the pixels SP. The gate driver 610 may provide gate signals to the gate lines GL, and the emission control driver 620 may provide emission signals to the emission control lines EML.

Figure 5:
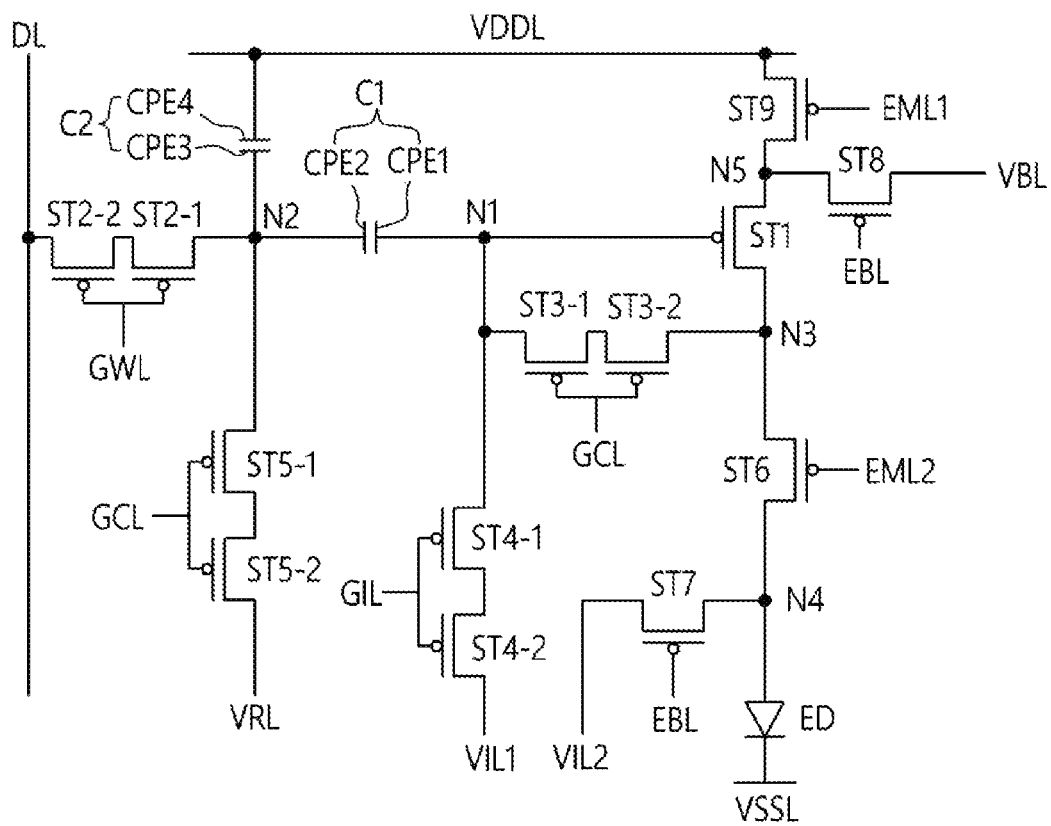
FIG. 5 is a circuit diagram of a pixel of a display device according to an embodiment.

FIG. 5 is a circuit diagram of a pixel of a display device according to an embodiment.

Referring to FIG. 5, an embodiment of the display panel 100 may include a plurality of pixels SP arranged along a plurality of rows and columns. Each of the plurality of pixels SP may be connected to a first gate line GWL, a second gate line GCL, a third gate line GIL, a fourth gate line EBL, a first emission control line EML1, a second emission control line EML2, a data line DL, a driving voltage line VDDL, a first initialization voltage line VIL1, a second initialization voltage line VIL2, a reference voltage line VRL, bias voltage line VBL, and a low potential line VSSL.

A pixel SP may include a pixel circuit and a light emitting element ED. In an embodiment, for example, the pixel circuit may include first to ninth transistors ST1 to ST9 and first and second capacitors C1 and C2.

The first transistor ST1 may include a gate electrode, a source electrode, and a drain electrode. The first transistor ST1 may control a source-drain current (Isd) (hereinafter, referred to as "driving current") according to the data voltage applied to the gate electrode. The driving current (Isd) flowing through the channel of the first transistor ST1 may be proportional to the square of a difference between the threshold voltage Vth and the voltage (Vsg) between the source electrode and the gate electrode of the first transistor ST1 ($Isd=k \times (Vsg-Vth)^2$). Here, k denotes a proportional coefficient determined by the structure and physical characteristics of the first transistor ST1, Vsg denotes a source-gate voltage of the first transistor ST1, and Vth denotes a threshold voltage of the first transistor ST1.

The light emitting element ED may emit light by receiving a driving current (Isd). The light emission amount or luminance of the light emitting element ED may be proportional to the magnitude of the driving current (Isd).

In an embodiment, for example, the light emitting element ED may be an organic light emitting diode including a first electrode, a second electrode, and an organic light emitting layer disposed between the first electrode and the second electrode. In such an embodiment, the first electrode of the light emitting element ED may be a pixel electrode, and the second electrode may be a common electrode. In an alternative embodiment, for example, the light emitting element ED may be an inorganic light emitting element including a first electrode, a second electrode, and an inorganic semiconductor disposed between the first electrode and the second electrode. In another alternative embodiment, for example, the light emitting element ED may be a quantum dot light emitting element including a first electrode, a second electrode, and a quantum dot light emitting layer disposed between the first electrode and the second electrode. In another alternative embodiment, for example, the light emitting element ED may be a micro LED.

The first electrode of the light emitting element ED may be connected to a fourth node N4. The first electrode of the light emitting element ED may be connected to the drain electrode of the sixth transistor ST6, and the source electrode of the seventh transistor ST7. The second electrode of the light emitting element ED may be connected to the low potential line VSSL. The second electrode of the light emitting element ED may receive a low potential voltage from the low potential line VSSL.

The second transistor ST2 may be turned on by a first gate signal of the first gate line GWL to electrically connect the data line DL with a second node N2 that is a third capacitor electrode CPE3 of the second capacitor C2. The second transistor ST2 may be turned on in response to the first gate signal to supply the data voltage to the second node N2. The data voltage supplied to the second node N2 may be transferred to a first node N1, which is the gate electrode of the first transistor ST1, by the first capacitor C1. The second transistor ST2 may include a first-second transistor ST2-1 and a second-second transistor ST2-2 connected to each other in series. The first-second transistor ST2-1 and the second-second transistor ST2-2 may be connected to each other in series between the data line DL and the second node N2. The gate electrode of the first-second transistor ST2-1 and the gate electrode of the second-second transistor ST2-2 may be integrally formed with each other as a single unitary and indivisible part and electrically connected to the first gate line GWL. The drain electrode of the first-second transistor ST2-1 may be electrically connected to the second node N2, and the source electrode of the second-second transistor ST2-2 may be electrically connected to the data line DL. The source electrode of the first-second transistor ST2-1 and the drain electrode of the second-second transistor ST2-2 may be integrally formed with each other as a single unitary and indivisible part.

The third transistor ST3 may be turned on by a second gate signal of the second gate line GCL to electrically connect a third node N3, that is a drain electrode of the first transistor ST1, with the first node N1, that is a gate electrode of the first transistor ST1. The third transistor ST3 may include a first-third transistor ST3-1 and a second-third transistor ST3-2 connected to each other in series. The first-third transistor ST3-1 and the second-third transistor ST3-2 may be connected to each other in series between the first node N1 and the third node N3. The gate electrode of the first-third transistor ST3-1 and the gate electrode of the second-third transistor ST3-2 may be integrally formed with each other as a single unitary and indivisible part and electrically connected to the second gate line GCL. The drain electrode of the first-third transistor ST3-1 may be electrically connected to the first node N1, and the source electrode of the second-third transistor ST3-2 may be electrically connected to the third node N3. The source electrode of the first-third transistor ST3-1 and the drain electrode of the second-third transistor ST3-2 may be integrally formed with each other as a single unitary and indivisible part.

The first-third transistor ST3-1 and the second-third transistor ST3-2 may have excellent leakage current characteristics. Therefore, the first-third transistor ST3-1 and the second-third transistor ST3-2 may prevent leakage current from flowing in the first node N1, which is the gate electrode of the first transistor ST1, and stably maintain the voltage inside the pixel SP. Leakage current characteristics of the first-third transistor ST3-1 and the second-third transistor ST3-2 will be described in detail with reference to FIGS. 10 and 11.

The fourth transistor ST4 may be turned on by a third gate signal of the third gate line GIL to electrically connect the first node N1, which is the gate electrode of the first transistor ST1, with the first initialization voltage line VIL1. The fourth transistor ST4 may be turned on based on a third gate signal to discharge the first node N1 to a first initialization voltage. The fourth transistor ST4 may include a first-fourth transistor ST4-1 and a second-fourth transistor ST4-2 connected to each other in series. The first-fourth transistor ST4-1 and the second-fourth transistor ST4-2 may be connected to each other in series between the first node N1 and the first initialization voltage line VIL1. The gate electrode of the first-fourth transistor ST4-1 and the gate electrode of the second-fourth transistor ST4-2 may be integrally formed with each other as a single unitary and indivisible part and electrically connected to the third gate line GIL. The source electrode of the first-fourth transistor ST4-1 may be electrically connected to the first node N1, and the drain electrode of the second-fourth transistor ST4-2 may be electrically connected to the first initialization voltage line VIL1. The drain electrode of the first-fourth transistor ST4-1 and the source electrode of the second-fourth transistor ST4-2 may be integrally formed with each other as a single unitary and indivisible part.

The first-fourth transistor ST4-1 and the second-fourth transistor ST4-2 may have excellent leakage current characteristics. Therefore, first-fourth transistor ST4-1 and the second-fourth transistor ST4-2 may prevent leakage current from flowing in the first node N1, which is the gate electrode of the first transistor ST1, and stably maintain the voltage inside the pixel SP. Leakage current characteristics of the first-fourth transistor ST4-1 and the second-fourth transistor ST4-2 will be described in detail with reference to FIGS. 12 and 13.

The fifth transistor ST5 may be turned on by the second gate signal of the second gate line GCL to electrically connect the second node N2, which is the third capacitor electrode CPE3 of the second capacitor C2, with the reference voltage line VRL. The fifth transistor ST5 may be turned on based on the second gate signal to supply a reference voltage to the second node N2. The fifth transistor ST5 may include a first-fifth transistor ST5-1 and a second-fifth transistor ST5-2 connected to each other in series. The first-fifth transistor ST5-1 and the second-fifth transistor ST5-2 may be connected to each other in series between the second node N2 and the reference voltage line VRL. The gate electrode of the first-fifth transistor ST5-1 and the gate electrode of the second-fifth transistor ST5-2 may be integrally formed with each other as a single unitary and indivisible part and electrically connected to the second gate line GCL. The drain electrode of the first-fifth transistor ST5-1 may be electrically connected to the second node N2, and the source electrode of the second-fifth transistor ST5-2 may be electrically connected to the reference voltage line VRL. The source electrode of the first-fifth transistor ST5-1 and the drain electrode of the second-fifth transistor ST5-2 may be integrally formed with each other as a single unitary and indivisible part.

The sixth transistor ST6 may be turned on by a second emission signal of the second emission control line EML2 to electrically connect the third node N3, which is the drain electrode of the first transistor ST1, with a fourth node N4, which is the first electrode of the light emitting element ED. The gate electrode of the sixth transistor ST6 may be electrically connected to the second emission control line EML2, the source electrode thereof may be electrically connected to the third node N3, and the drain electrode thereof may be electrically connected to the fourth node N4.

The seventh transistor ST7 may be turned on by a fourth gate signal of the fourth gate line EBL to electrically connect fourth node N4, which is the first electrode of the light emitting element ED, with the second initialization voltage line VIL2. The seventh transistor ST7 may be turned on based on the fourth gate signal to discharge the first electrode of the light emitting element ED to a second initialization voltage VIL2. The gate electrode of the seventh transistor ST7 may be electrically connected to the fourth gate line EBL, the source electrode thereof may be electrically connected to the fourth node N4, and the drain electrode thereof may be electrically connected to the second initialization voltage line VIL2.

The eighth transistor ST8 may be turned on by the fourth gate signal of the fourth gate line EBL to electrically connect a fifth node N5, which is the source electrode of the first transistor ST1, with the bias voltage line VBL. The eighth transistor ST8 may be turned on based on the fourth gate signal to supply a bias voltage to the fifth node N5. The eighth transistor ST8 may improve hysteresis of the first transistor ST1 by supplying the bias voltage to the source electrode of the first transistor ST1. The gate electrode of the eighth transistor ST8 may be electrically connected to the fourth gate line EBL, the source electrode thereof may be electrically connected to the bias voltage line VBL, and the drain electrode thereof may be electrically connected to the fifth node N5.

The ninth transistor ST9 may be turned on by a first emission signal of the first emission control line EML1 to electrically connect the fifth node N5, which is the source electrode of the first transistor ST1, with the driving voltage line VDDL. The gate electrode of the ninth transistor ST9 may be electrically connected to the first emission control line EML1, the source electrode thereof may be electrically connected to the driving voltage line VDDL, and the drain electrode thereof may be electrically connected to the fifth node N5. When all of the ninth transistor ST9, the first transistor ST1, and the sixth transistor ST6 are turned on, driving current may be supplied to the light emitting element ED.

Each of the first to ninth transistors ST1 to ST9 may include a silicon-based active layer. In an embodiment, for example, each of the first to ninth transistors ST1 to ST9 may include an active layer including or made of low-temperature polycrystalline silicon (LTPS). The active layer including or made of low-temperature polycrystalline silicon may have a high electron mobility and improved turn-on characteristics. Accordingly, the display device 10 includes first to ninth transistors ST1 to ST9 having improved turn-on characteristics, so that the plurality of pixels SP can be driven stably and efficiently.

Each of the first to ninth transistors ST1 to ST9 may be a p-type transistor. For example, each of the first to ninth transistors ST1 to ST9 may output a current flowing into the source electrode to the drain electrode in response to a gate-low voltage applied to the gate electrode.

In an alternative embodiment, for example, at least one among the first to ninth transistors ST1 to ST9 may include an oxide-based active layer. A transistor including an oxide-based active layer may have a coplanar structure in which a gate electrode is disposed at the top. A transistor including an oxide-based active layer may be an n-type transistor and may output current introduced into the drain electrode via the source electrode based on a gate-high voltage applied to the gate electrode.

The first capacitor C1 may be electrically connected between the first node N1 and the second node N2. The first capacitor C1 may include a first capacitor electrode CPE1 and a second capacitor electrode CPE2. The first capacitor electrode CPE1 may be electrically connected to the first node N1 and the second capacitor electrode CPE2 may be electrically connected to the second node N2, so that a potential difference between the first node N1 and the second node N2 can be maintained.

The second capacitor C2 may be electrically connected between the second node N2 and the driving voltage line VDDL. The second capacitor C2 may include a third capacitor electrode CPE3 and a fourth capacitor electrode CPE4. The third capacitor electrode CPE3 may be electrically connected to the second node N2 and the fourth capacitor electrode CPE4 may be electrically connected to the driving voltage line VDDL, so that a potential difference between the second node N2 and the driving voltage line VDDL can be maintained.

Figure 6:
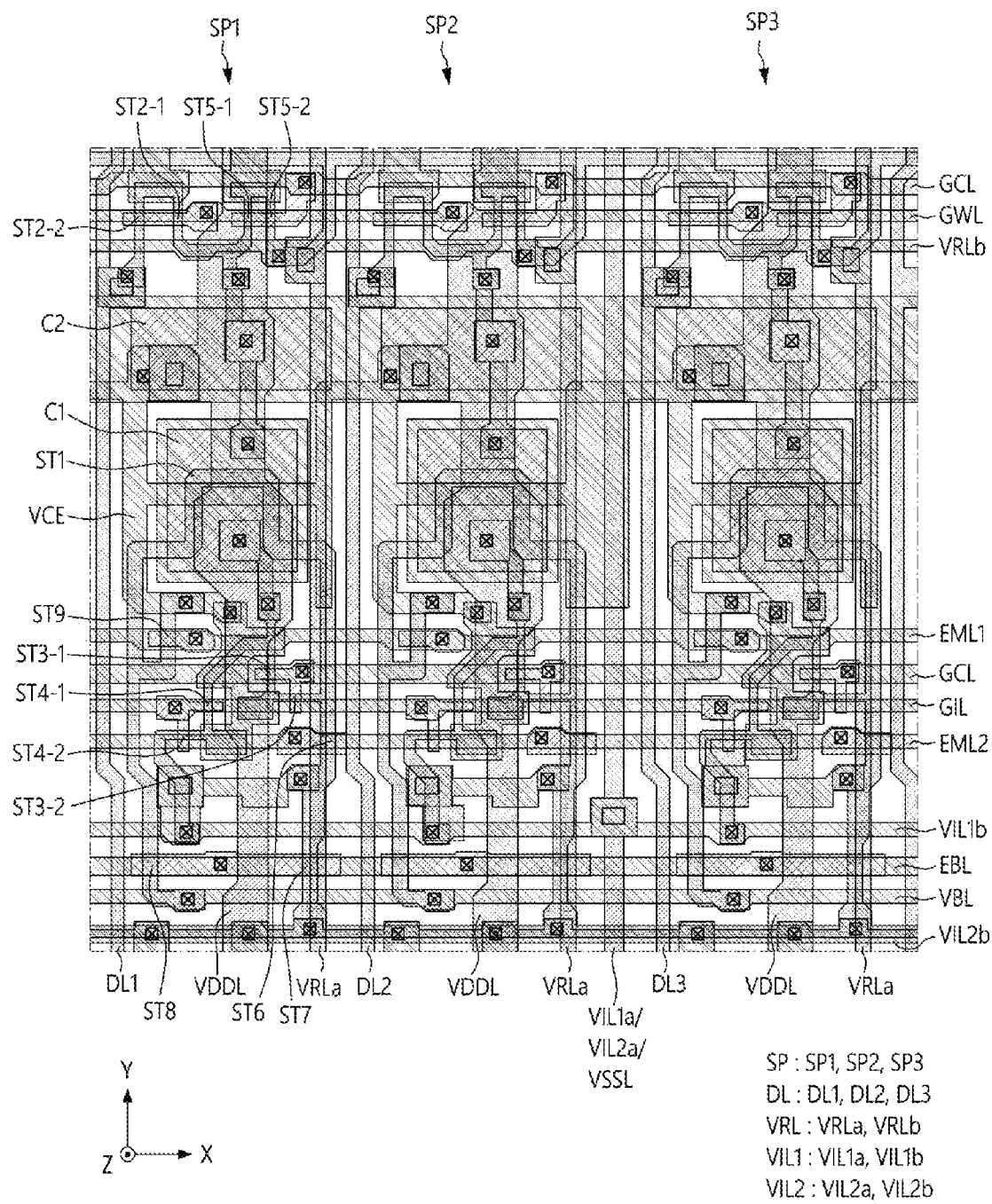
FIG. 6 is a plan view illustrating a pixel of a display device according to an embodiment.
Figure 7:
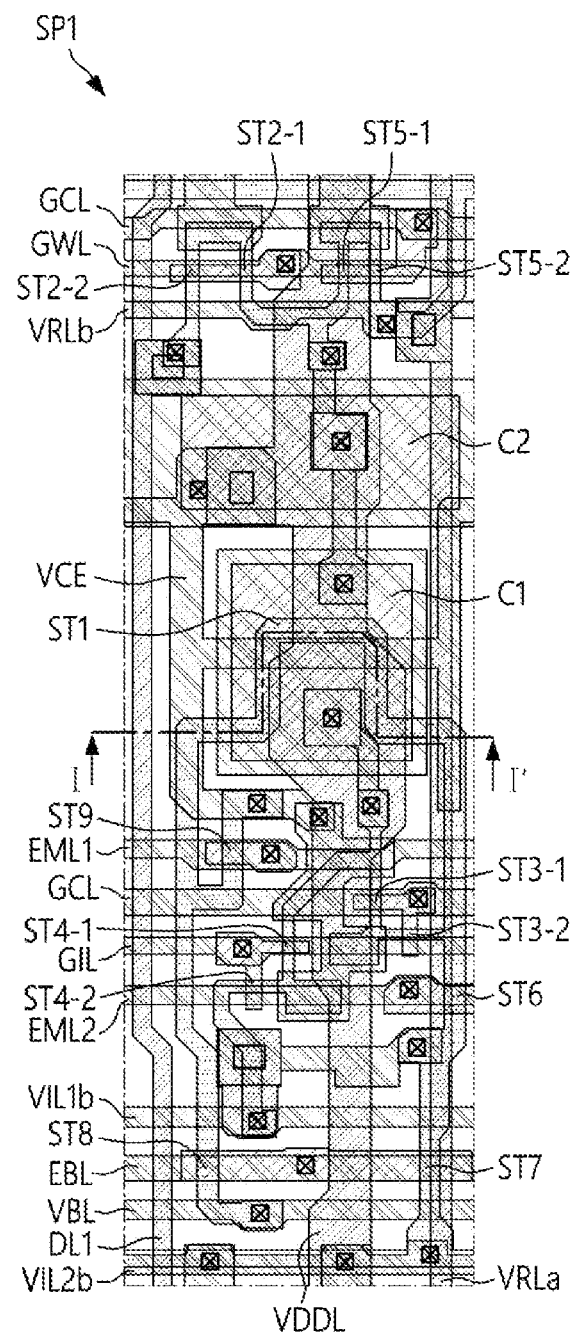
FIG. 7 is a plan view illustrating a first pixel of FIG. 6.
Figure 8:
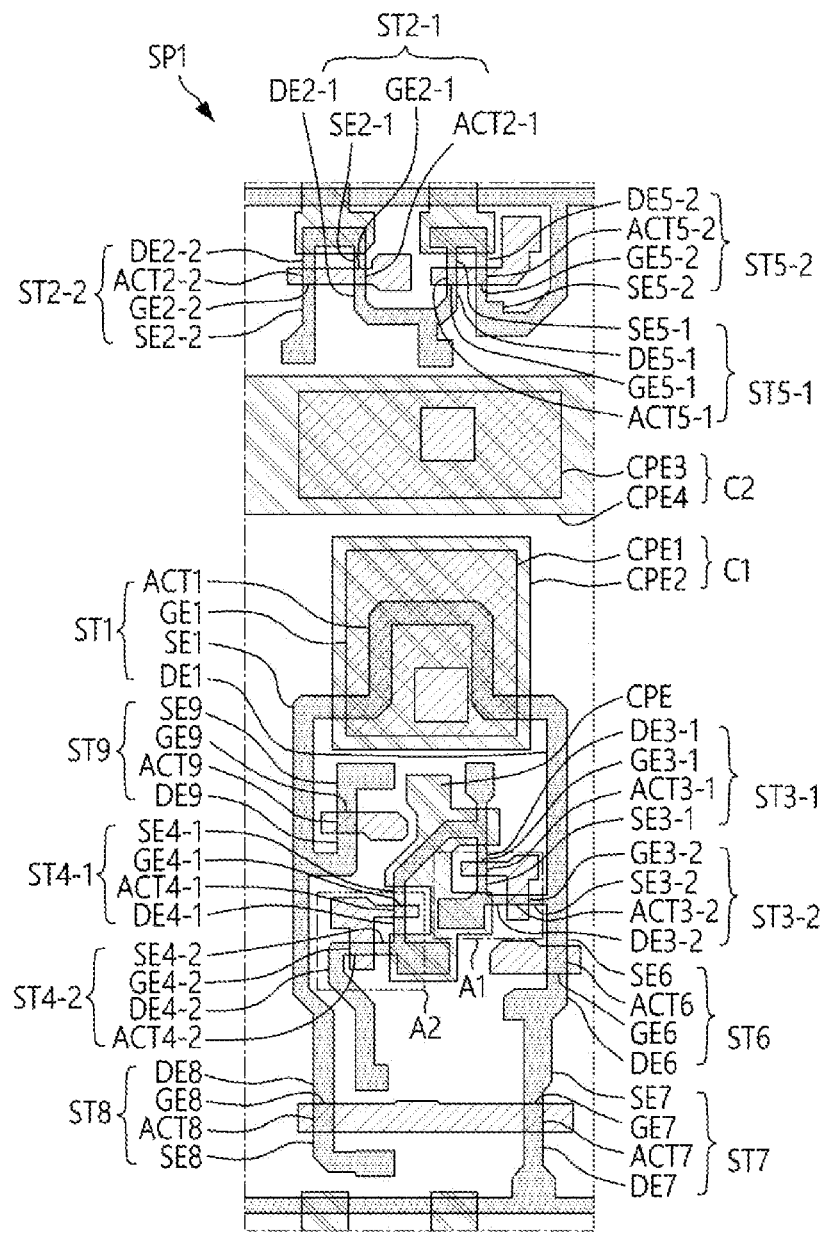
FIG. 8 is a plan view showing some layers of FIG. 7.
Figure 9:
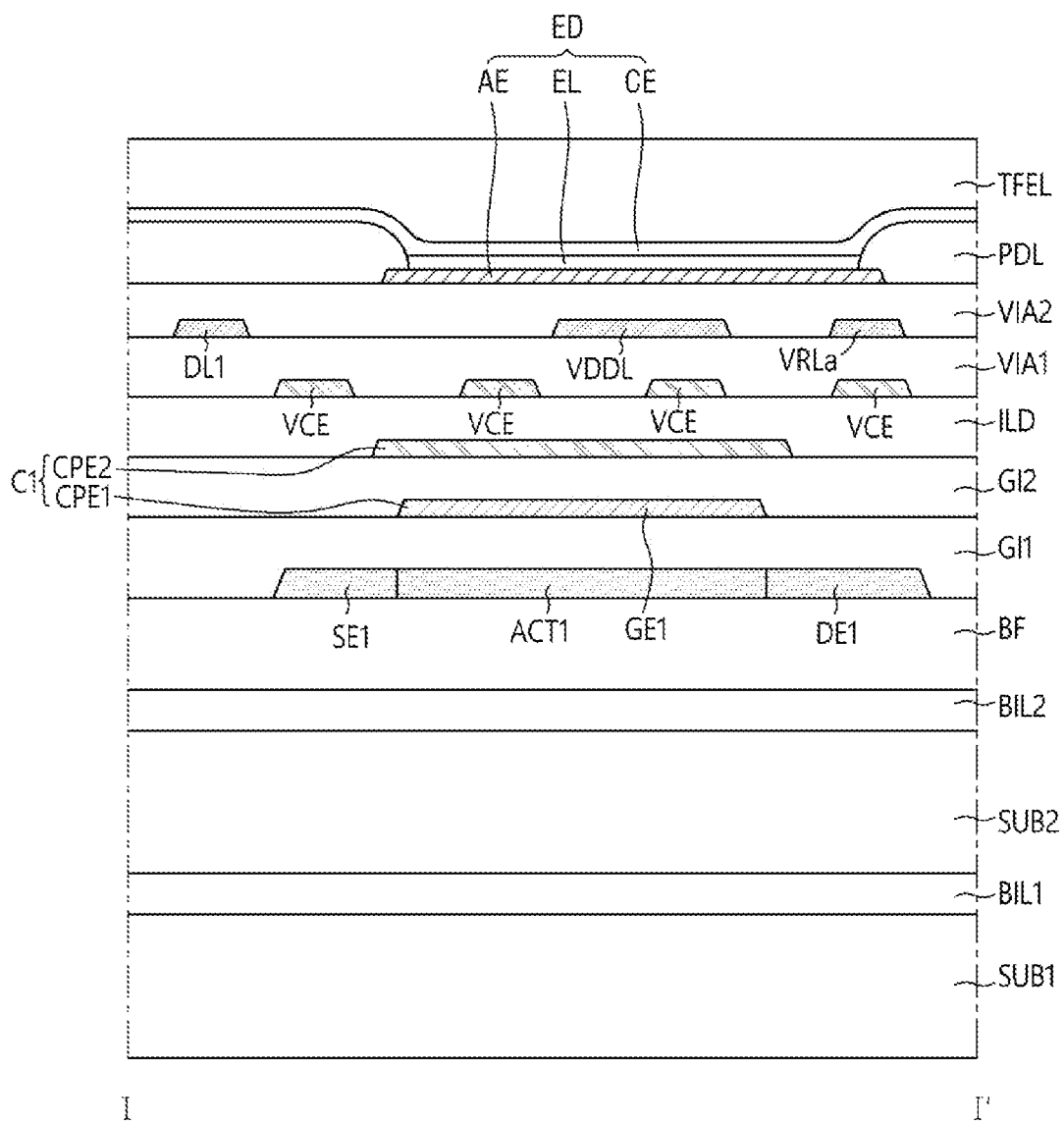
FIG. 9 is a cross-sectional view taken along line I-I' of FIG. 7.

FIG. 6 is a plan view illustrating a pixel of a display device according to an embodiment, and FIG. 7 is a plan view illustrating a first pixel of FIG. 6. FIG. 8 is a plan view showing some layers of FIG. 7, and FIG. 9 is a cross-sectional view taken along line I-I' of FIG. 7.

Referring to FIGS. 6 to 9, in an embodiment of a display device, the pixel SP may include first to third pixels SP1, SP2, and SP3. The first to third pixels SP1, SP2, and SP3 may emit light of different colors from each other. Each of the first to third pixels SP1, SP2, and SP3 may include first to ninth transistors ST1 to ST9 and first and second capacitors C1 and C2.

The first transistor ST1 may include a semiconductor region ACT1, a gate electrode GE1, a source electrode SE1, and a drain electrode DE1. The semiconductor region ACT1, the source electrode SE1, and the drain electrode DE1 of the first transistor ST1 may be disposed in (or defined by) an active layer ACTL, and the gate electrode GE1 of the first transistor ST1 may be disposed in (or defined by) a gate layer GTL1. The gate electrode GE1 of the first transistor ST1 may be defined by a part of the first capacitor electrode CPE1 of the first gate layer GTL1 and overlap the semiconductor region ACT1 of the first transistor ST1.

The first capacitor electrode CPE1 may be connected to a drain electrode DE3-1 of the first-third transistor ST3-1 and source electrode SE4-1 of the first-fourth transistor ST4-1 through the connection electrode of a first source metal layer SDL1. The source electrode SE1 of the first transistor ST1 may be integrally formed with a drain electrode DE8 of the eighth transistor ST8 and a drain electrode DE9 of the ninth transistor ST9 as a single unitary and indivisible part. The drain electrode DE1 of the first transistor ST1 may be integrally formed with a source electrode SE3-2 of the second-third transistor ST3-2 and a source electrode SE6 of the sixth transistor ST6 as a single unitary and indivisible part.

The second transistor ST2 may include a first-second transistor ST2-1 and a second-second transistor ST2-2 connected to each other in series. The first-second transistor ST2-1 may include a semiconductor region ACT2-1, a gate electrode GE2-1, a source electrode SE2-1, and a drain electrode DE2-1, and the second-second transistor ST2-2 may include a semiconductor region ACT2-2, a gate electrode GE2-2, a source electrode SE2-2, and a drain electrode DE2-2. The semiconductor regions ACT2-1 and ACT2-2, the source electrodes SE2-1 and SE2-2, and the drain electrodes DE2-1 and DE2-2 of the first-second transistor ST2-1 and the second-second transistor ST2-2 may be disposed in (or defined by) the active layer ACTL, and the gate electrodes GE2-1 and GE2-2 may be disposed in (or defined by) the first gate layer GTL1. The gate electrode GE2-1 of the first-second transistor ST2-1 may overlap the semiconductor region ACT2-1 of the first-second transistor ST2-1, and the gate electrode GE2-2 of the second-second transistor ST2-2 may overlap the semiconductor region ACT2-2 of the second-second transistor ST2-2.

The gate electrode GE2-1 of the first-second transistor ST2-1 and the gate electrode GE2-2 of the second-second transistor ST2-2 may be integrally formed with each other as a single unitary and indivisible part to be electrically connected to the first gate line GWL. The first gate line GWL may be disposed in (or defined by) the first source metal layer SDL1 and extend in the X-axis direction. The drain electrode DE2-1 of the first-second transistor ST2-1 may be integrally formed with a drain electrode DE5-1 of the first-fifth transistor ST5-1 as a single unitary and indivisible part, and may be electrically connected to the second capacitor electrode CPE2 of a second gate layer GTL2 and the third capacitor electrode CPE3 of the first gate layer GTL1 through the connection electrode of the first source metal layer SDL1. The source electrode SE2-1 of the first-second transistor ST2-1 and the drain electrode DE2-2 of the second-second transistor ST2-2 may be integrally formed with each other as a single unitary and indivisible part. The source electrode SE2-2 of the second-second transistor ST2-2 may be electrically connected to a first data line DLI. The first data line DLI may be disposed in (or defined by) a second source metal layer SDL2 and extend in the Y-axis direction.

The third transistor ST3 may include a first-third transistor ST3-1 and a second-third transistor ST3-2 connected to each other in series. The first-third transistor ST3-1 may include a semiconductor region ACT3-1, a gate electrode GE3-1, a source electrode SE3-1, and the drain electrode DE3-1, and the second-third transistor ST3-2 may include a semiconductor region ACT3-2, a gate electrode GE3-2, the source electrode SE3-2, and a drain electrode DE3-2. The semiconductor regions ACT3-1 and ACT3-2, the source electrodes SE3-1 and SE3-2, and the drain electrodes DE3-1 and DE3-2 of the first-third transistor ST3-1 and the second-third transistor ST3-2 may be disposed in (or defined by) the active layer ACTL, and the gate electrodes GE3-1 and GE3-2 may be disposed in (or defined by) the first gate layer GTL1. The gate electrode GE3-1 of the first-third transistor ST3-1 may overlap the semiconductor region ACT3-1 of the first-third transistor ST3-1, and the gate electrode GE3-2 of the second-third transistor ST3-2 may overlap the semiconductor region ACT3-2 of the second-third transistor ST3-2.

The gate electrode GE3-1 of the first-third transistor ST3-1 and the gate electrode GE3-2 of the second-third transistor ST3-2 may be integrally formed with each other as a single unitary and indivisible part to be electrically connected to the second gate line GCL. The second gate line GCL may be disposed in (or defined by) the first source metal layer SDL1 and extend in the X-axis direction. The drain electrode DE3-1 of the first-third transistor ST3-1 may be integrally formed with the source electrode SE4-1 of the first-fourth transistor ST4-1 as a single unitary and indivisible part, and may be electrically connected to the first capacitor electrode CPE1 of the first gate layer GTL1 through the connection electrode of the first source metal layer SDL1. The source electrode SE3-1 of the first-third transistor ST3-1 and the drain electrode DE3-2 of the second-third transistor ST3-2 may be integrally formed with each other as a single unitary and indivisible part. The source electrode SE3-2 of the second-third transistor ST3-2 may be integrally formed with the drain electrode DE1 of the first transistor ST1 and the source electrode SE6 of the sixth transistor ST6 as a single unitary and indivisible part.

The fourth transistor ST4 may include a first-fourth transistor ST4-1 and a second-fourth transistor ST4-2 connected to each other in series. The first-fourth transistor ST4-1 may include a semiconductor region ACT4-1, a gate electrode GE4-1, the source electrode SE4-1, and a drain electrode DE4-1, and the second-fourth transistor ST4-2 may include a semiconductor region ACT4-2, a gate electrode GE4-2, a source electrode SE4-2, and a drain electrode DE4-2. The semiconductor regions ACT4-1 and ACT4-2, the source electrodes SE4-1 and SE4-2, and the drain electrodes DE4-1 and DE4-2 of the first-fourth transistor ST4-1 and the second-fourth transistor ST4-2 may be disposed in (or defined by) the active layer ACTL, and the gate electrodes GE4-1 and GE4-2 may be disposed in (or defined by) the first gate layer GTL1. The gate electrode GE4-1 of the first-fourth transistor ST4-1 may overlap the semiconductor region ACT4-1 of the first-fourth transistor ST4-1, and the gate electrode GE4-2 of the second-fourth transistor ST4-2 may overlap the semiconductor region ACT4-2 of the second-fourth transistor ST4-2.

The gate electrode GE4-1 of the first-fourth transistor ST4-1 and the gate electrode GE4-2 of the second-fourth transistor ST4-2 may be integrally formed with each other as a single unitary and indivisible part to be electrically connected to the third gate line GIL. The third gate line GIL may be disposed in (or defined by) the first source metal layer SDL1 and extend in the X-axis direction. The source electrode SE4-1 of the first-fourth transistor ST4-1 may be integrally formed with the drain electrode DE3-1 of the first-third transistor ST3-1 as a single unitary and indivisible part, and may be electrically connected to the first capacitor electrode CPE1 of the first gate layer GTL1 through the connection electrode of the first source metal layer SDL1. The drain electrode DE4-1 of the first-fourth transistor ST4-1 and the source electrode SE4-2 of the second-fourth transistor ST4-2 may be integrally formed with each other as a single unitary and indivisible part. The drain electrode DE4-2 of the second-fourth transistor ST4-2 may be electrically connected to the first initialization voltage line VIL1.

The first initialization voltage line VIL1 may include a first vertical initialization voltage line VIL1a and a first horizontal initialization voltage line VIL1b. The first vertical initialization voltage line VIL1a may be disposed in (or defined by) the second source metal layer SDL2 and extend in the Y-axis direction. The first vertical initialization voltage line VIL1a may be disposed in some pixel columns among the plurality of pixel columns. The first horizontal initialization voltage line VIL1b may be disposed in (or defined by) the first source metal layer SDL1 and extend in the X-axis direction. The first horizontal initialization voltage line VIL1b may be in contact with the drain electrode DE4-2 of the second-fourth transistor ST4-2. The first horizontal initialization voltage line VIL1b may supply the first initialization voltage received from the first vertical initialization voltage line VIL1a to the drain electrode DE4-2 of the second-fourth transistor ST4-2.

The fifth transistor ST5 may include a first-fifth transistor ST5-1 and a second-fifth transistor ST5-2 connected to each other in series. The first-fifth transistor ST5-1 may include a semiconductor region ACT5-1, a gate electrode GE5-1, a source electrode SE5-1, and the drain electrode DE5-1, and the second-fifth transistor ST5-2 may include a semiconductor region ACT5-2, a gate electrode GE5-2, a source electrode SE5-2, and a drain electrode DE5-2. The semiconductor regions ACT5-1 and ACT5-2, the source electrodes SE5-1 and SE5-2, and the drain electrodes DE5-1 and DE5-2 of the first-fifth transistor ST5-1 and the second-fifth transistor ST5-2 may be disposed in (or defined by) the active layer ACTL, and the gate electrodes GE5-1 and GE5-2 may be disposed in (or defined by) the first gate layer GTL1. The gate electrode GE5-1 of the first-fifth transistor ST5-1 may overlap the semiconductor region ACT5-1 of the first-fifth transistor ST5-1, and the gate electrode GE5-2 of the second-fifth transistor ST5-2 may overlap the semiconductor region ACT5-2 of the second-fifth transistor ST5-2.

The gate electrode GE5-1 of the first-fifth transistor ST5-1 and the gate electrode GE5-2 of the second-fifth transistor ST5-2 may be integrally formed with each other as a single unitary and indivisible part to be electrically connected to the second gate line GCL. The second gate line GCL may be disposed in (or defined by) the first source metal layer SDL1 and extend in the X-axis direction. The drain electrode DE5-1 of the first-fifth transistor ST5-1 may be integrally formed with the drain electrode DE2-1 of the first-second transistor ST2-1 as a single unitary and indivisible part, and may be electrically connected to the second capacitor electrode CPE2 of the second gate layer GTL2 and the third capacitor electrode CPE3 of the first gate layer GTL1 through the connection electrode of the first source metal layer SDL1. The source electrode SE5-1 of the first-fifth transistor ST5-1 and the drain electrode DE5-2 of the second-fifth transistor ST5-2 may be integrally formed with each other as a single unitary and indivisible part. The source electrode SE5-2 of the second-fifth transistor ST5-2 may be electrically connected to the reference voltage line VRL.

The reference voltage line VRL may include a vertical reference voltage line VRLa and a horizontal reference voltage line VRLb. The vertical reference voltage line VRLa may be disposed in (or defined by) the second source metal layer SDL2 and extend in the Y-axis direction. The horizontal reference voltage line VRLb may be disposed in (or defined by) the first source metal layer SDL1 and extend in the X-axis direction. The horizontal reference voltage line VRLb may be in contact with the source electrode SE5-2 of the second-fifth transistor ST5-2. The horizontal reference voltage line VRLb may supply the reference voltage received from the vertical reference voltage line VRLa to the source electrode SE5-2 of the second-fifth transistor ST5-2.

The sixth transistor ST6 may include a semiconductor region ACT6, a gate electrode GE6, the source electrode SE6, and a drain electrode DE6. The semiconductor region ACT6, the source electrode SE6, and the drain electrode DE6 of the sixth transistor ST6 may be disposed in (or defined by) the active layer ACTL, and the gate electrode GE6 of the sixth transistor ST6 may be disposed in (or defined by) the gate layer GTL1. The gate electrode GE6 of the sixth transistor ST6 may overlap the semiconductor region ACT6 of the sixth transistor ST6.

The gate electrode GE6 of the sixth transistor ST6 may be electrically connected to the second emission control line EML2. The second emission control line EML2 may be disposed in (or defined by) the first source metal layer SDL1 and extend in the X-axis direction. The source electrode SE6 of the sixth transistor ST6 may be integrally formed with the drain electrode DE1 of the first transistor ST1 and the source electrode SE3-2 of the second-third transistor ST3-2 as a single unitary and indivisible part. The drain electrode DE6 of the sixth transistor ST6 may be integrally formed with a source electrode SE7 of the seventh transistor ST7 as a single unitary and indivisible part, and may be electrically connected to the first electrode of the light emitting element ED or the pixel electrode AE through the connection electrodes of the first and second source metal layers SDL1 and SDL2.

The second electrode or common electrode CE of the light emitting element ED may be electrically connected to the low potential line VSSL and may receive a low potential voltage from the low potential line VSSL. The low potential line VSSL may be disposed in (or defined by) the second source metal layer SDL2 and extend in the Y-axis direction. The low potential line VSSL may be disposed in some pixel columns among a plurality of pixel columns.

The seventh transistor ST7 may include a semiconductor region ACT7, a gate electrode GE7, the source electrode SE7, and a drain electrode DE7. The semiconductor region ACT7, the source electrode SE7, and the drain electrode DE7 of seventh transistor ST7 may be disposed in (or defined by) the active layer ACTL, and the gate electrode GE7 of the seventh transistor ST7 may be disposed in (or defined by) the gate layer GTL1. The gate electrode GE7 of the seventh transistor ST7 may overlap the semiconductor region ACT7 of the seventh transistor ST7.

The gate electrode GE7 of the seventh transistor ST7 may be electrically connected to the fourth gate line EBL. The fourth gate line EBL may be disposed in (or defined by) the first source metal layer SDL1 and extend in the X-axis direction. The source electrode SE7 of the seventh transistor ST7 may be integrally formed with the drain electrode DE6 of the sixth transistor ST6 as a single unitary and indivisible part, and may be electrically connected to the first electrode or the pixel electrode AE of the light emitting element through the connection electrode of the first and second source metal layers SDL1 and SDL2. The drain electrode DE7 may be electrically connected to the second initialization voltage line VIL2.

The second initialization voltage line VIL2 may include a second vertical initialization voltage line VIL2a and a second horizontal initialization voltage line VIL2b. The second vertical initialization voltage line VIL2a may be disposed in (or defined by) the second source metal layer SDL2 and extend in the Y-axis direction. The second vertical initialization voltage line VIL2a may be disposed in some pixel columns among the plurality of pixel columns. The second horizontal initialization voltage line VIL2b may be disposed in (or defined by) the first source metal layer SDL1 and extend in the X-axis direction. The second horizontal initialization voltage line VIL2b may be in contact with the drain electrode DE7 of the seventh transistor ST7. The second horizontal initialization voltage line VIL2b may supply the second initialization voltage received from the second vertical initialization voltage line VIL2a to the drain electrode DE7 of the seventh transistor ST7.

The eighth transistor ST8 may include a semiconductor region ACT8, a gate electrode GE8, a source electrode SE8, and the drain electrode DE8. The semiconductor region ACT8, the source electrode SE8, and the drain electrode DE8 of eighth transistor ST8 may be disposed (or defined by) in the active layer ACTL, and the gate electrode GE8 of the eighth transistor ST8 may be disposed in (or defined by) the gate layer GTL1. The gate electrode GE8 of the eighth transistor ST8 may overlap the semiconductor region ACT8 of the eighth transistor ST8.

The gate electrode GE8 of the eighth transistor ST8 may be electrically connected to the fourth gate line EBL. The fourth gate line EBL may be disposed in (or defined by) the first source metal layer SDL1 and extend in the X-axis direction. The source electrode SE8 of the eighth transistor ST8 may be electrically connected to the bias voltage line VBL. The bias voltage line VBL may be disposed in (or defined by) the first source metal layer SDL1 and extend in the X-axis direction. The drain electrode DE8 of the eighth transistor ST8 may be integrally formed with the source electrode SE1 of the first transistor ST1 and the drain electrode DE9 of the ninth transistor ST9 as a single unitary and indivisible part.

The ninth transistor ST9 may include a semiconductor region ACT9, a gate electrode GE9, a source electrode SE9, and a drain electrode DE9. The semiconductor region ACT9, the source electrode SE9, and the drain electrode DE9 of ninth transistor ST9 may be disposed in (or defined by) the active layer ACTL, and the gate electrode GE9 of the ninth transistor ST9 may be disposed in (or defined by) the gate layer GTL1. The gate electrode GE9 of the ninth transistor ST9 may overlap the semiconductor region ACT9 of the ninth transistor ST9.

The gate electrode GE9 of the ninth transistor ST9 may be electrically connected to the first emission control line EML1. The first emission control line EML1 may be disposed in (or defined by) the first source metal layer SDL1 and extend in the X-axis direction. The source electrode SE9 of the ninth transistor ST9 may be electrically connected to the driving voltage line VDDL. The driving voltage line VDDL may be disposed in (or defined by) the second source metal layer SDL2 and extend in the Y-axis direction. A voltage connection line VCE may be disposed in (or defined by) the first source metal layer SDL1 and connected between the driving voltage line VDDL and the source electrode SE9 of the ninth transistor ST9. The voltage connection line VCE may supply the driving voltage received from the driving voltage line VDDL to the source electrode SE9 of the ninth transistor ST9. The drain electrode DE9 of the ninth transistor ST9 may be integrally formed with the source electrode SE1 of the first transistor ST1 and the drain electrode DE8 of the eighth transistor ST8 as a single unitary and indivisible part.

The first capacitor C1 may include a first capacitor electrode CPE1 and a second capacitor electrode CPE2. The first capacitor electrode CPE1 may be disposed in (or defined by) the first gate layer GTL1 to be integrally formed with the gate electrode GE1 of the first transistor ST1 as a single unitary and indivisible part, and may be electrically connected to the drain electrode DE3-1 of the first-third transistor ST3-1 and the source electrode SE4-1 of the first-fourth transistor ST4-1.

The second capacitor electrode CPE2 may be disposed in (or defined by) the second gate layer GTL2 to be electrically connected to the third capacitor electrode CPE3, the drain electrode DE2-1 of the first-second transistor ST2-1, and the drain electrode DE5-1 of the first-fifth transistor ST5-1.

The second capacitor C2 may include a third capacitor electrode CPE3 and a fourth capacitor electrode CPE4. The third capacitor electrode CPE3 may be disposed in (or defined by) the first gate layer GTL1 to be electrically connected to the second capacitor electrode CPE2, the drain electrode DE2-1 of the first-second transistor ST2-1, and the drain electrode DE5-1 of the first-fifth transistor ST5-1.

The fourth capacitor electrode CPE4 may be disposed in (or defined by) the second gate layer GTL2 to be electrically connected to the driving voltage line VDDL of the second source metal layer SDL2 through the voltage connection line VCE of the first source metal layer SDL1.

In an embodiment, as shown in FIG. 9, the display panel 100 may include a first substrate SUB1, a first barrier insulating layer BIL1, a second substrate SUB2, a second barrier insulating layer BIL2, a buffer layer BF, an active layer ACTL, a first gate insulating layer GI1, a first gate layer GTL1, a second gate insulating layer GI2, a second gate layer GTL2, an interlayer insulating layer ILD, a first source metal layer SDL1, a first via layer VIA1, a second source metal layer SDL2, a second via layer VIA2, a light emitting element ED, a pixel defining layer PDL, and an encapsulation layer TFEL.

The first substrate SUB1 may be a base substrate or a base member. The first substrate SUB1 may be a flexible substrate that can be bent, folded, or rolled. In an embodiment, for example, the first substrate SUB1 may include, but is not limited to, a polymer resin such as PI. In an alternative embodiment, for example, the first substrate SUB1 may include a glass material or a metal material.

The first barrier insulating layer BIL1 may be disposed on the first substrate SUB1. The first barrier insulating layer BIL1 may include an inorganic insulating layer that can prevent penetration of air or moisture. In an embodiment, for example, the first barrier insulating layer BIL1 may include, but is not limited to, at least one selected from a silicon nitride layer, a silicon oxynitride layer, a silicon oxide layer, a titanium oxide layer, an aluminum oxide layer, and an amorphous silicon layer.

The second substrate SUB2 may be disposed on the first barrier insulating layer BIL1. The second substrate SUB2 may be a flexible substrate that can be bent, folded, or rolled. The second substrate SUB2 may include or be made of at least one selected from the materials listed above in the description of the first substrate SUB1.

The second barrier insulating layer BIL2 may be disposed on the second substrate SUB2. The second barrier insulating layer BIL2 may include an inorganic insulating layer that can prevent penetration of air or moisture. The second barrier insulating layer BIL2 may include or be made of at least one selected from the materials listed above in the description of the first barrier insulating layer BIL1.

The buffer layer BF may be disposed on the second barrier insulating layer BIL2. The buffer layer BF may include an inorganic insulating layer that can prevent penetration of air or moisture. The buffer layer BF may include, but is not limited to, at least one selected from a silicon nitride layer, a silicon oxynitride layer, a silicon oxide layer, a titanium oxide layer, an aluminum oxide layer, and an amorphous silicon layer.

The active layer ACTL may be disposed on the buffer layer BF. The active layer ACTL may include the semiconductor region ACT1, the source electrode SE1, and the drain electrode DE1 of the first transistor ST1.

The first gate insulating layer GI1 may be disposed on the active layer ACTL and the buffer layer BF. The first gate insulating layer GI1 may insulate the gate electrode GE1 from the semiconductor region ACT1 of the first transistor ST1. The first gate insulating layer GI1 may include, but is not limited to, at least one selected from a silicon nitride layer, a silicon oxynitride layer, a silicon oxide layer, a titanium oxide layer, an aluminum oxide layer, and an amorphous silicon layer.

The first gate layer GTL1 may be disposed on the first gate insulating layer GI1. The first gate layer GTL1 may include the gate electrode GE1 of the first transistor ST1 and the first capacitor electrode CPE1.

The second gate insulating layer GI2 may be disposed on the first gate layer GTL1 and the first gate insulating layer GI1. The second gate insulating layer GI2 may insulate the first capacitor electrode CPE1 from the second capacitor electrode CPE2. The second gate insulating layer GI2 may include or be made of at least one selected from the materials listed above in the description of the first gate insulating layer GI1.

The second gate layer GTL2 may be disposed on the second gate insulating layer GI2. The second gate layer GTL2 may include a second capacitor electrode CPE2.

The interlayer insulating layer ILD may be disposed on the second gate layer GTL2 and the second gate insulating layer GI2.

The first source metal layer SDL1 may include the voltage connection line VCE.

The first via layer VIA1 may be disposed on the first source metal layer SDL1 and the interlayer insulating layer ILD. In an embodiment, for example, the first via layer VIA1 may include, but is not limited to, an organic insulating material such as PI, but is not limited thereto.

The second source metal layer SDL2 may be disposed on the first via layer VIA1. The second source metal layer SDL2 may include the first data line DLI, the driving voltage line VDDL, and a vertical reference voltage line VRLa.

The second via layer VIA2 may be disposed on the second source metal layer SDL2 and the first via layer VIA1. In an embodiment, for example, the second via layer VIA2 may include, but is not limited to, an organic insulating material such as PI, but is not limited thereto.

The pixel defining layer PDL may be disposed on the second via layer VIA2. The pixel defining layer PDL may define a plurality of emission areas or a plurality of opening areas. The pixel defining layer PDL may separate and insulate the pixel electrodes AE of the plurality of pixels SP.

The light emitting element ED may be disposed on the second via layer VIA2. Each light emitting element ED of the plurality of pixels SP may include a pixel electrode AE, a light emitting layer EL, and a common electrode CE. The pixel electrode AE may be disposed on the second via layer VIA2. The pixel electrode AE may overlap one of the plurality of emission areas defined by the pixel defining layer PDL. The pixel electrode AE may receive a driving current from the pixel circuit of the pixel SP.

A light emitting layer EL may be disposed on the pixel electrode AE. In an embodiment, for example, the light emitting layer EL may be, but is not limited to, an organic light emitting layer made of an organic material. In an embodiment where the light emitting layer EL is an organic light emitting layer, when a pixel circuit of the pixel SP applies a predetermined voltage to the pixel electrode AE and the common electrode CE of the light emitting element ED receives a common voltage or a cathode voltage, holes may move to the organic light emitting layer EL through the hole transporting layer, electrons may move to the organic light emitting layer EL through the electron transporting layer, and holes and electrons may combine with each other in the organic light emitting layer EL to emit light.

The common electrode CE may be disposed on the light emitting layer EL. For example, the common electrode CE may be implemented as an electrode common to all pixels SP, instead of being disposed as a separated electrode for each of the pixels SP. The common electrode CE may be disposed on the light emitting layer EL in the plurality of emission areas, and may be disposed on the pixel defining layer PDL in an area excluding the plurality of emission areas.

The encapsulation layer TFEL may be disposed on the common electrode CE to cover the plurality of light emitting elements ED. The encapsulation layer TFEL may include at least one inorganic layer to prevent penetration of air or moisture into the plurality of light emitting elements ED. The encapsulation layer TFEL may include at least one organic layer to protect the plurality of light emitting elements ED from foreign substances such as dust.

Figure 10:
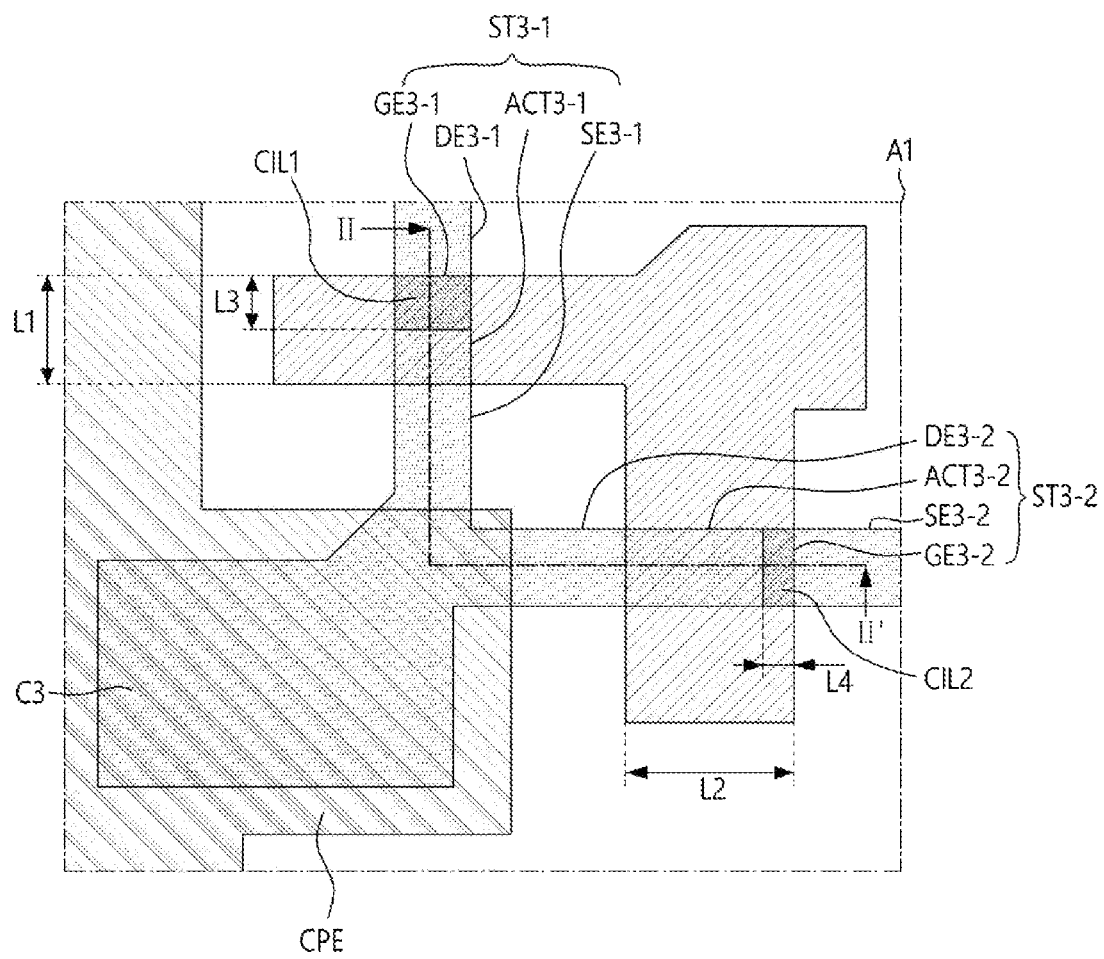
FIG. 10 is an enlarged view of an example of area A1 of FIG. 8.
Figure 11:
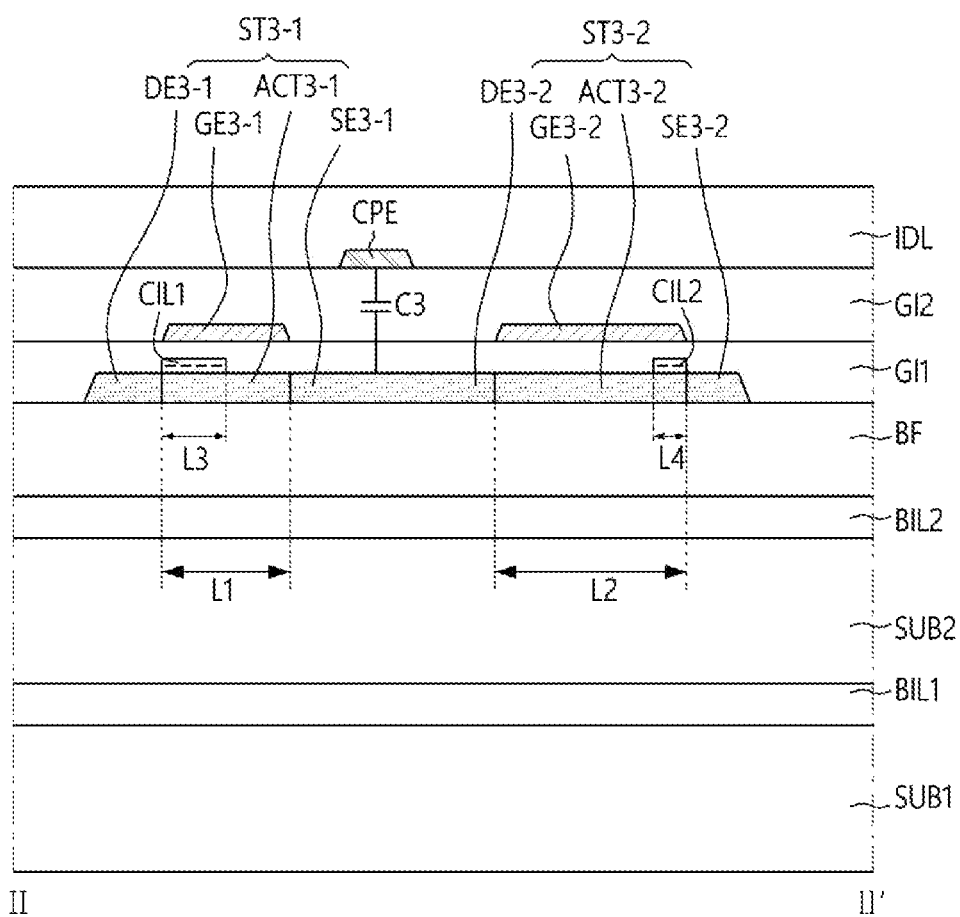
FIG. 11 is a cross-sectional view taken along line II-II' of FIG. 10.

FIG. 10 is an enlarged view of an example of area A1 of FIG. 8, and FIG. 11 is a cross-sectional view taken along line II-II' of FIG. 10.

Referring to FIGS. 10 and 11, the third transistor ST3 may include a first-third transistor ST3-1 and a second-third transistor ST3-2 connected to each other in series. The first-third transistor ST3-1 may include a semiconductor region ACT3-1, a gate electrode GE3-1, a source electrode SE3-1, and a drain electrode DE3-1, and the second-third transistor ST3-2 may include a semiconductor region ACT3-2, a gate electrode GE3-2, a source electrode SE3-2, and a drain electrode DE3-2. The semiconductor regions ACT3-1 and ACT3-2, the source electrodes SE3-1 and SE3-2, and the drain electrodes DE3-1 and DE3-2 of the first-third transistor ST3-1 and the second-third transistor ST3-2 may be disposed in (or defined by) the active layer ACTL, and the gate electrodes GE3-1 and GE3-2 may be disposed in (or defined by) the first gate layer GTL1. The gate electrode GE3-1 of the first-third transistor ST3-1 may overlap the semiconductor region ACT3-1 of the first-third transistor ST3-1, and the gate electrode GE3-2 of the second-third transistor ST3-2 may overlap the semiconductor region ACT3-2 of the second-third transistor ST3-2.

In an embodiment, the semiconductor region ACT3-1 of the first-third transistor ST3-1 may have a first length L1 in the Y-axis direction, and the semiconductor region ACT3-2 of the second-third transistor ST3-2 may have a second length L2 in the X-axis direction. The width in the X-axis direction of the semiconductor region ACT3-1 of the first-third transistor ST3-1 and the width in the Y-axis direction of the semiconductor region ACT3-2 of the second-third transistor ST3-2 may be substantially the same as each other. The second length L2 may be longer than the first length L1.

A first charge injection layer CIL1 may be disposed adjacent to the drain electrode DE3-1 of the first-third transistor ST3-1 on the semiconductor region ACT3-1 of the first-third transistor ST3-1. The first charge injection layer CIL1 may be disposed to overlap the semiconductor region ACT3-1 of the first-third transistor ST3-1 and not to overlap the drain electrode DE3-1 of the first-third transistor ST3-1 in a thickness direction of the display panel 100 or the first substrate SUB1. The first charge injection layer CIL1 may be formed on the semiconductor region ACT3-1 of the first-third transistor ST3-1 through an aging process or a high off-stress process for supplying a high voltage to the gate electrode GE3-1 of the first-third transistor ST3-1. The first charge injection layer CIL1 may have a third length L3 in the Y-axis direction.

A second charge injection layer CIL2 may be disposed adjacent to the source electrode SE3-2 of the second-third transistor ST3-2 on the semiconductor region ACT3-2 of the second-third transistor ST3-2. The second charge injection layer CIL2 may be disposed to overlap the semiconductor region ACT3-2 of the second-third transistor ST3-2 and not to overlap the source electrode SE3-2 of the second-third transistor ST3-2 in the thickness direction of the display panel 100 or the first substrate SUB1. The second charge injection layer CIL2 may be formed on the semiconductor region ACT3-2 of the second-third transistor ST3-2 through an aging process or a high off-stress process for supplying a high voltage to the gate electrode GE3-2 of the second-third transistor ST3-2. The second charge injection layer CIL2 may have a fourth length L4 in the X-axis direction.

In such an embodiment, the display device 10 may inject relatively stronger off-stress into the first-third transistor ST3-1 than second-third transistor ST3-2. The charge injection density formed at the interface between the semiconductor region ACT3-1 and the gate electrode GE3-1 of the first-third transistor ST3-1 may be greater than the charge injection density formed at the interface between the semiconductor region ACT3-2 and the gate electrode GE3-2 of the second-third transistor ST3-2. In an embodiment, for example, the charge injection density of the first charge injection layer CIL1 may be about twice or greater than the charge injection density of the second charge injection layer CIL2, but is not limited thereto. The charge injection area formed at the interface between the semiconductor region ACT3-1 and the gate electrode GE3-1 of the first-third transistor ST3-1 may be greater than the charge injection area formed at the interface between the semiconductor region ACT3-2 and the gate electrode GE3-2 of the second-third transistor ST3-2. In an embodiment, for example, the charge injection area of the first charge injection layer CIL1 may be about 1.5 times or greater than the charge injection area of the second charge injection layer CIL2, but is not limited thereto. Accordingly, in such an embodiment, the third length L3 may be longer than the fourth length L4.

The display device 10 may differentially inject charges into the first-third transistor ST3-1 and the second-third transistor ST3-2, thereby reducing the leakage current flowing in the first-third transistor ST3-1 and the second-third transistor ST3-2 and reducing the threshold voltage shift. Accordingly, the first-third transistor ST3-1 and the second-third transistor ST3-2 may have improved leakage current characteristics. The first-third transistor ST3-1 and the second-third transistor ST3-2 may effectively prevent leakage current from flowing in the first node N1, which is the gate electrode of the first transistor ST1, and stably maintain the voltage in the pixel SP.

The source electrode SE3-1 of the first-third transistor ST3-1 and the drain electrode DE3-2 of the second-third transistor ST3-2 may be integrally formed with each other as a single unitary and indivisible part. The capacitor electrode CPE may be disposed in (or defined by) the second gate layer GTL2. The third capacitor C3 may be formed between the source electrode SE3-1 of the first-third transistor ST3-1 and the capacitor electrode CPE to reduce the kickback voltage. The third capacitor C3 stably maintains voltages of the source electrode SE3-1 of the first-third transistor ST3-1 and the drain electrode DE3-2 of the second-third transistor ST3-2. Accordingly, leakage current flowing through the first-third transistor ST3-1 and the second-third transistor ST3-2 may be reduced.

Figure 12:
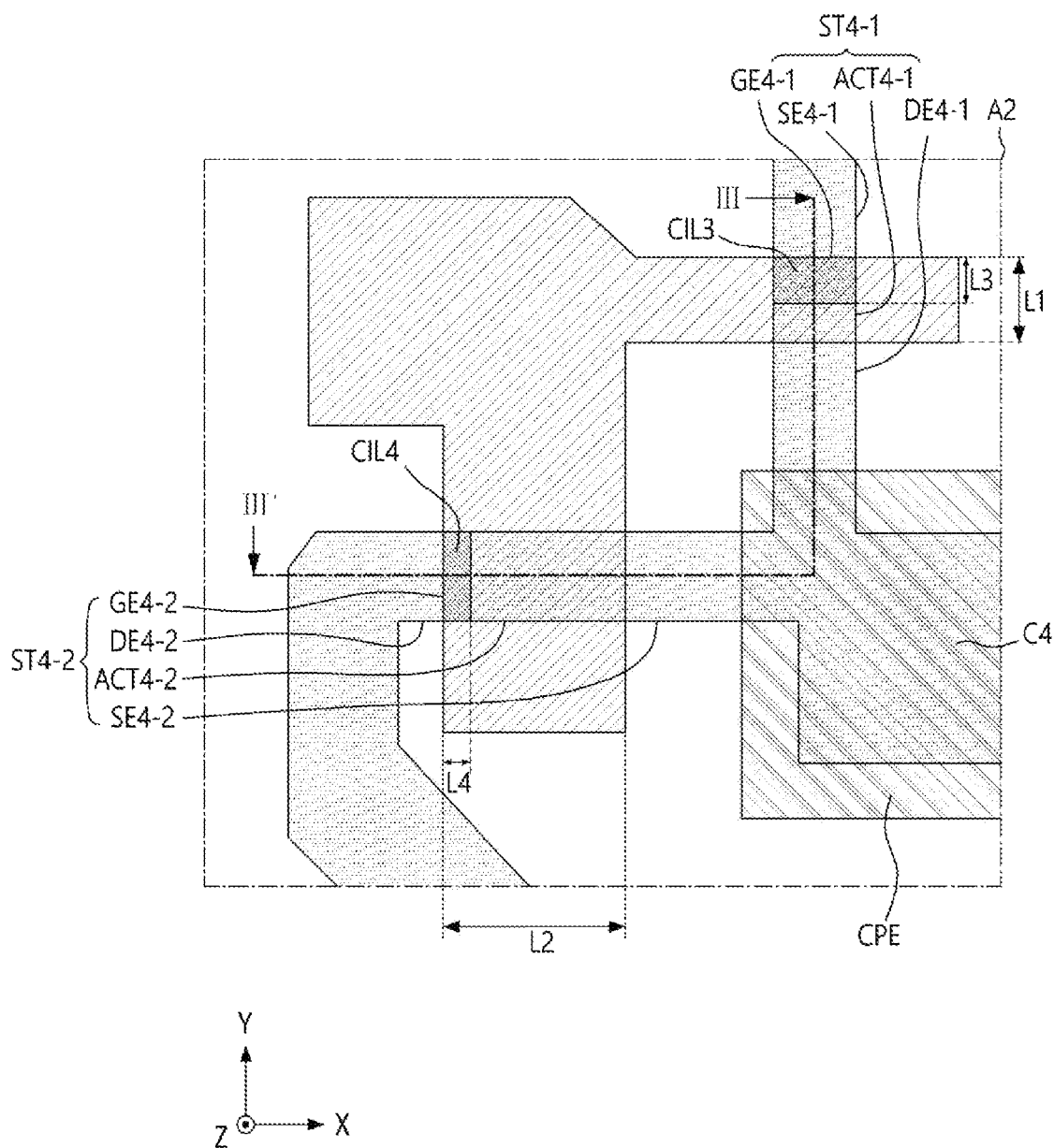
FIG. 12 is an enlarged view of an example of area A2 of FIG. 8.
Figure 13:
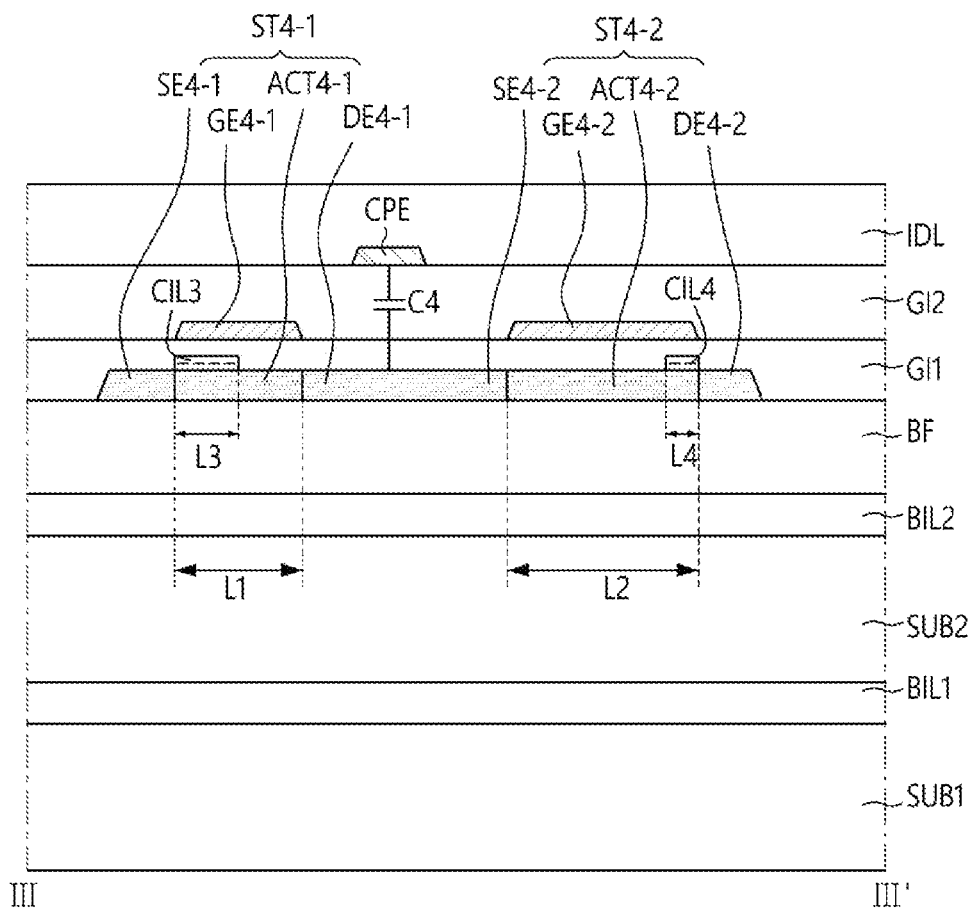
FIG. 13 is a cross-sectional view taken along line III-III' of FIG. 10.

FIG. 12 is an enlarged view of an example of area A2 of FIG. 8, and FIG. 13 is a cross-sectional view taken along line III-III' of FIG. 10.

Referring to FIGS. 12 and 13, the fourth transistor ST4 may include a first-fourth transistor ST4-1 and a second-fourth transistor ST4-2 connected to each other in series. The first-fourth transistor ST4-1 may include a semiconductor region ACT4-1, a gate electrode GE4-1, a source electrode SE4-1, and a drain electrode DE4-1, and the second-fourth transistor ST4-2 may include a semiconductor region ACT4-2, a gate electrode GE4-2, a source electrode SE4-2, and a drain electrode DE4-2. The semiconductor regions ACT4-1 and ACT4-2, the source electrodes SE4-1 and SE4-2, and the drain electrodes DE4-1 and DE4-2 of the first-fourth transistor ST4-1 and the second-fourth transistor ST4-2 may be disposed in (or defined by) the active layer ACTL, and the gate electrodes GE4-1 and GE4-2 may be disposed in (or defined by) the first gate layer GTL1. The gate electrode GE4-1 of the first-fourth transistor ST4-1 may overlap the semiconductor region ACT4-1 of the first-fourth transistor ST4-1, and the gate electrode GE4-2 of the second-fourth transistor ST4-2 may overlap the semiconductor region ACT4-2 of the second-fourth transistor ST4-2.

The semiconductor region ACT4-1 of the first-fourth transistor ST4-1 may have a first length L1 in the Y-axis direction, and the semiconductor region ACT4-2 of the second-fourth transistor ST4-2 may have a second length L2 in the X-axis direction. The width in the X-axis direction of the semiconductor region ACT4-1 of the first-fourth transistor ST4-1 and the width in the Y-axis direction of the semiconductor region ACT4-2 of the second-fourth transistor ST4-2 may be substantially the same. The second length L2 may be longer than the first length L1.

A third charge injection layer CIL3 may be disposed adjacent to the source electrode SE4-1 of the first-fourth transistor ST4-1 on the semiconductor region ACT4-1 of the first-fourth transistor ST4-1. The third charge injection layer CIL3 may be disposed to overlap the semiconductor region ACT4-1 of the first-fourth transistor ST4-1 and not to overlap the source electrode SE4-1 of the first-fourth transistor ST4-1 in the thickness direction of the display panel 100 or the first substrate SUB1. The third charge injection layer CIL3 may be formed on the semiconductor region ACT4-1 of the first-fourth transistor ST4-1 through an aging process or a high off-stress process for supplying a high voltage to the gate electrode GE4-1 of the first-fourth transistor ST4-1. The third charge injection layer CIL3 may have a third length L3 in the Y-axis direction.

A fourth charge injection layer CIL4 may be disposed adjacent to the drain electrode DE4-2 of the second-fourth transistor ST4-2 on the semiconductor region ACT4-2 of the second-fourth transistor ST4-2. The fourth charge injection layer CIL4 may be disposed to overlap the semiconductor region ACT4-2 of the second-fourth transistor ST4-2 and not to overlap the drain electrode DE4-2 of the second-fourth transistor ST4-2 in the thickness direction of the display panel 100 or the first substrate SUB1. The fourth charge injection layer CIL4 may be formed on the semiconductor region ACT4-2 of the second-fourth transistor ST4-2 through an aging process or a high off-stress process for supplying a high voltage to the gate electrode GE4-2 of the second-fourth transistor ST4-2. The fourth charge injection layer CIL4 may have a fourth length L4 in the X-axis direction.

The display device 10 may inject relatively stronger off-stress into the first-fourth transistor ST4-1 than second-fourth transistor ST4-2. The charge injection density formed at the interface between the semiconductor region ACT4-1 and the gate electrode GE4-1 of the first-fourth transistor ST4-1 may be greater than the charge injection density formed at the interface between the semiconductor region ACT4-2 and the gate electrode GE4-2 of the second-fourth transistor ST4-2. In an embodiment, for example, the charge injection density of the third charge injection layer CIL3 may be about twice or greater than the charge injection density of the fourth charge injection layer CIL4, but is not limited thereto. The charge injection area formed at the interface between the semiconductor region ACT4-1 and the gate electrode GE4-1 of the first-fourth transistor ST4-1 may be greater than the charge injection area formed at the interface between the semiconductor region ACT4-2 and the gate electrode GE4-2 of the second-fourth transistor ST4-2. In an embodiment, for example, the charge injection area of the third charge injection layer CIL3 may be about 1.5 times or greater than the charge injection area of the fourth charge injection layer CIL4, but is not limited thereto. Accordingly, in such an embodiment, the third length L3 may be longer than the fourth length L4.

The display device 10 may differentially inject charges into the first-fourth transistor ST4-1 and the second-fourth transistor ST4-2, thereby reducing the leakage current flowing in the first-fourth transistor ST4-1 and the second-fourth transistor ST4-2 and reducing the threshold voltage shift. Accordingly, the first-fourth transistor ST4-1 and the second-fourth transistor ST4-2 may have improved leakage current characteristics. The first-fourth transistor ST4-1 and the second-fourth transistor ST4-2 may effectively prevent leakage current from flowing in the first node N1, which is the gate electrode of the first transistor ST1, and stably maintain the voltage in the pixel SP.

The drain electrode DE4-1 of the first-fourth transistor ST4-1 and the source electrode SE4-2 of the second-fourth transistor ST4-2 may be integrally formed with each other as a single unitary and indivisible part. The capacitor electrode CPE may be disposed in (or defined by) the second gate layer GTL2. A fourth capacitor C4 may be formed between the drain electrode DE4-1 of the first-fourth transistor ST4-1 and the capacitor electrode CPE to reduce the kickback voltage. The fourth capacitor C4 stably maintains voltages of the drain electrode DE4-1 of the first-fourth transistor ST4-1 and the source electrode SE4-2 of the second-fourth transistor ST4-2. Accordingly, leakage current flowing through the first-fourth transistor ST4-1 and the second-fourth transistor ST4-2 may be reduced.

Figure 14:
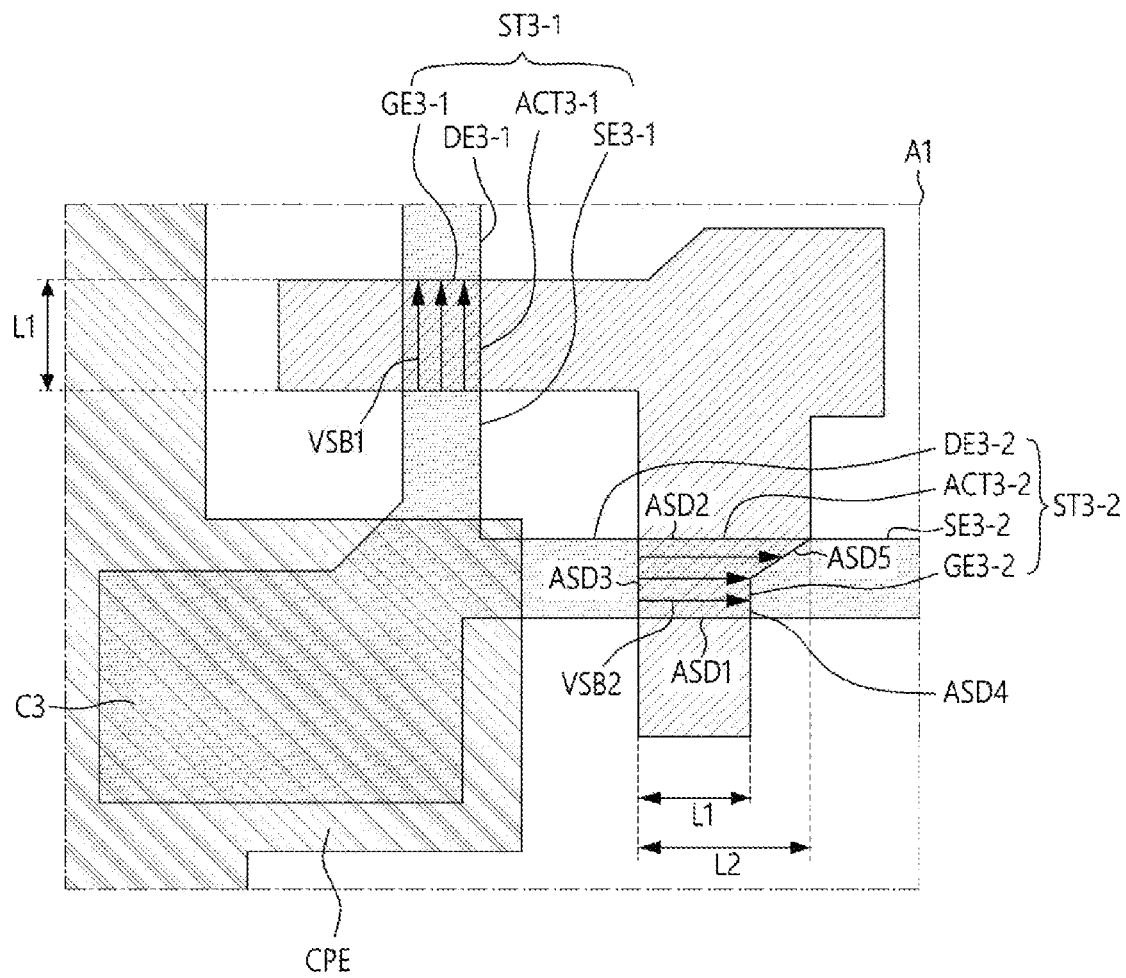
FIG. 14 is an enlarged view illustrating another example of area A1 of FIG. 8.

FIG. 14 is an enlarged view illustrating another example of area A1 of FIG. 8.

Referring to FIG. 14, the third transistor ST3 may include a first-third transistor ST3-1 and a second-third transistor ST3-2 connected to each other in series. The first-third transistor ST3-1 may include a semiconductor region ACT3-1, a gate electrode GE3-1, a source electrode SE3-1, and a drain electrode DE3-1, and the second-third transistor ST3-2 may include a semiconductor region ACT3-2, a gate electrode GE3-2, a source electrode SE3-2, and a drain electrode DE3-2.

The semiconductor region ACT3-1 of the first-third transistor ST3-1 may have a rectangular shape. The width in the X-axis direction of the semiconductor region ACT3-1 of the first-third transistor ST3-1 and the width in the Y-axis direction of the semiconductor region ACT3-2 of the second-third transistor ST3-2 may be substantially the same. The semiconductor region ACT3-1 of the first-third transistor ST3-1 may have a first length L1 in the Y-axis direction. The semiconductor region ACT3-1 of the first-third transistor ST3-1 may have a first source-body voltage VSB1 during operation of the pixel SP. The magnitude of the first source-body voltage VSB1 may be proportional to the length of the arrow in FIG. 14.

The semiconductor region ACT3-2 of the second-third transistor ST3-2 may have a pentagonal shape. A first side ASD1 of the semiconductor region ACT3-2 may extend in the X-axis direction and have a first length L1. A second side ASD2 of the semiconductor region ACT3-2 may extend parallel to the first side ASD1 and have a second length L2 greater than the first length L1. A third side ASD3 of the semiconductor region ACT3-2 may extend in the Y-axis direction between one side of the first side ASD1 and one side of the second side ASD2. A fourth side ASD4 of the semiconductor region ACT3-2 may extend parallel to the third side ASD3 from an opposing side of the first side ASD1, and a fifth side ASD5 may extend in a diagonal direction between the X-axis direction and the Y-axis direction from the fourth side ASD4. The semiconductor region ACT3-2 of the second-third transistor ST3-2 may have a second source-body voltage VSB2 during operation of the pixel SP. The magnitude of the second source-body voltage VSB2 may be proportional to the length of the arrow in FIG. 14.

Figure 15:
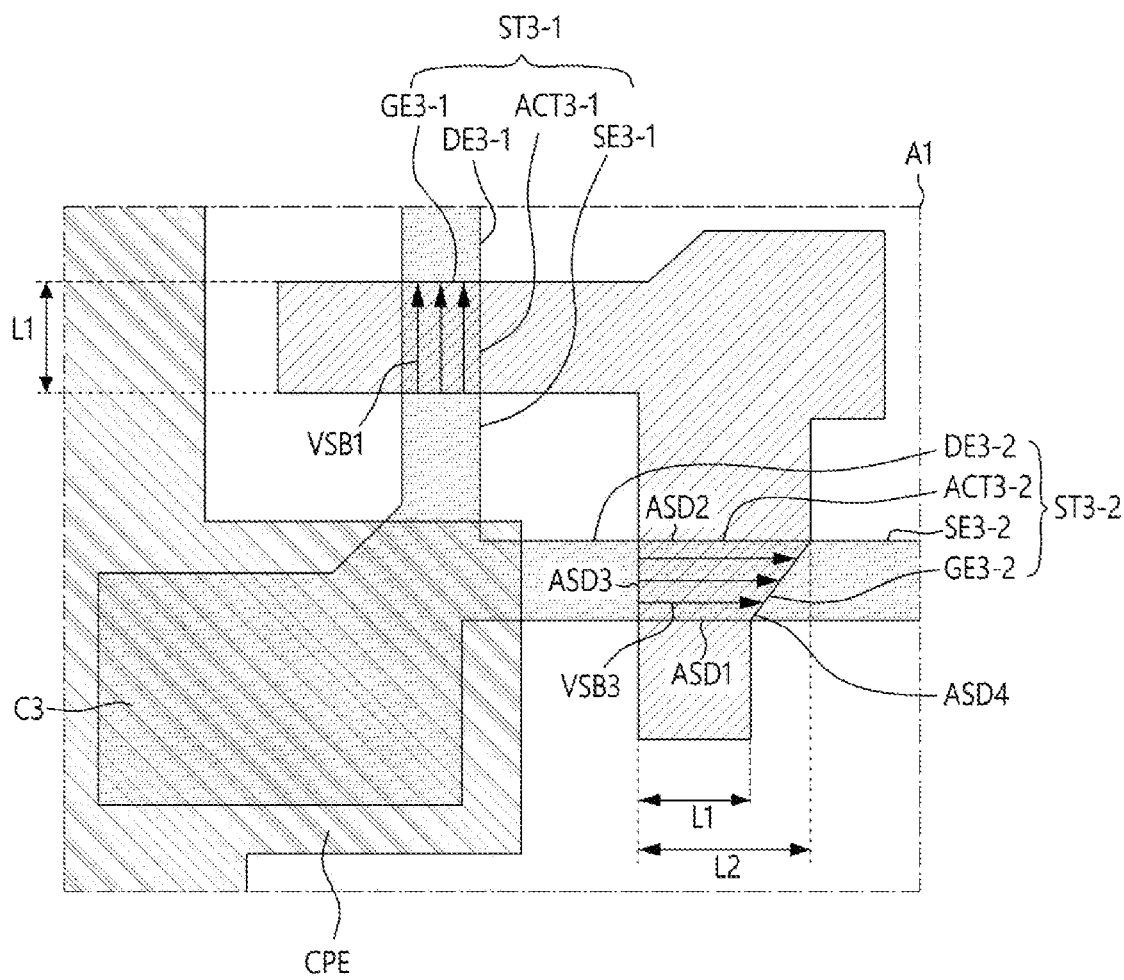
FIG. 15 is an enlarged view illustrating still another example of area A1 of FIG. 8.

FIG. 15 is an enlarged view illustrating still another example of area A1 of FIG. 8.

Referring to FIG. 15, the third transistor ST3 may include a first-third transistor ST3-1 and a second-third transistor ST3-2 connected to each other in series. The first-third transistor ST3-1 may include a semiconductor region ACT3-1, a gate electrode GE3-1, a source electrode SE3-1, and a drain electrode DE3-1, and the second-third transistor ST3-2 may include a semiconductor region ACT3-2, a gate electrode GE3-2, a source electrode SE3-2, and a drain electrode DE3-2.

The semiconductor region ACT3-1 of the first-third transistor ST3-1 may have a rectangular shape. The width in the X-axis direction of the semiconductor region ACT3-1 of the first-third transistor ST3-1 and the width in the Y-axis direction of the semiconductor region ACT3-2 of the second-third transistor ST3-2 may be substantially the same. The semiconductor region ACT3-1 of the first-third transistor ST3-1 may have a first length L1 in the Y-axis direction. The semiconductor region ACT3-1 of the first-third transistor ST3-1 may have a first source-body voltage VSB1 during operation of the pixel SP. The magnitude of the first source-body voltage VSB1 may be proportional to the length of the arrow in FIG. 15.

The semiconductor region ACT3-2 of the second-third transistor ST3-2 may have a trapezoidal shape. The first side ASD1 of the semiconductor region ACT3-2 may extend in the X-axis direction and have a first length L1. The second side ASD2 of the semiconductor region ACT3-2 may extend parallel to the first side ASD1 and have a second length L2 greater than the first length L1. The third side ASD3 of the semiconductor region ACT3-2 may extend in the Y-axis direction between one side of the first side ASD1 and one side of the second side ASD2. The fourth side ASD4 of the semiconductor region ACT3-2 may extend from an opposing side of the first side ASD1 to the other side of the second side ASD2 in a diagonal direction between the X-axis direction and the Y-axis direction. The semiconductor region ACT3-2 of the second-third transistor ST3-2 may have a third source-body voltage VSB3 during operation of the pixel SP. The magnitude of the third source-body voltage VSB3 may be proportional to the length of the arrow in FIG. 15.

In such an embodiment, since the third source-body voltage VSB3 of the semiconductor region ACT3-2 of the second-third transistor ST3-2 is greater than the first source-body voltage VSB1 of the semiconductor region ACT3-1 of the first-third transistor ST3-1, the magnitude of the leakage current flowing from one end of the third capacitor C3 to the second-third transistor ST3-2 may be greater than the leakage current flowing from one end of the third capacitor C3 to the first-third transistor ST3-1. Accordingly, in such an embodiment, the display device 10 includes the semiconductor region ACT3-2 of the second-third transistor ST3-2 in the trapezoidal shape, such that leakage current may be effectively prevented from flowing in the first node N1, which is the gate electrode of the first transistor ST1, and the voltage in the pixel SP may be maintained stably.

The third source-body voltage VSB3 of the semiconductor region ACT3-2 of the second-third transistor ST3-2 of FIG. 15 may be greater than the second source-body voltage VSB2 of the semiconductor region ACT3-2 of the second-third transistor ST3-2 of FIG. 14. The length of the arrow of the third source-body voltage VSB3 of FIG. 15 may be longer than the length of the arrow of the second source-body voltage VSB2 of FIG. 14. Accordingly, the magnitude of the leakage current flowing through the second-third transistor ST3-2 of FIG. 15 may be greater than the magnitude of the leakage current flowing through the second-third transistor ST3-2 of FIG. 14. Accordingly, in such an embodiment, the display device 10 includes the semiconductor region ACT3-2 of the second-third transistor ST3-2 in the trapezoidal shape, such that leakage current may be effectively prevented from flowing in the first node N1, which is the gate electrode of the first transistor ST1, and the voltage in the pixel SP may be maintained stably.

Figure 16:
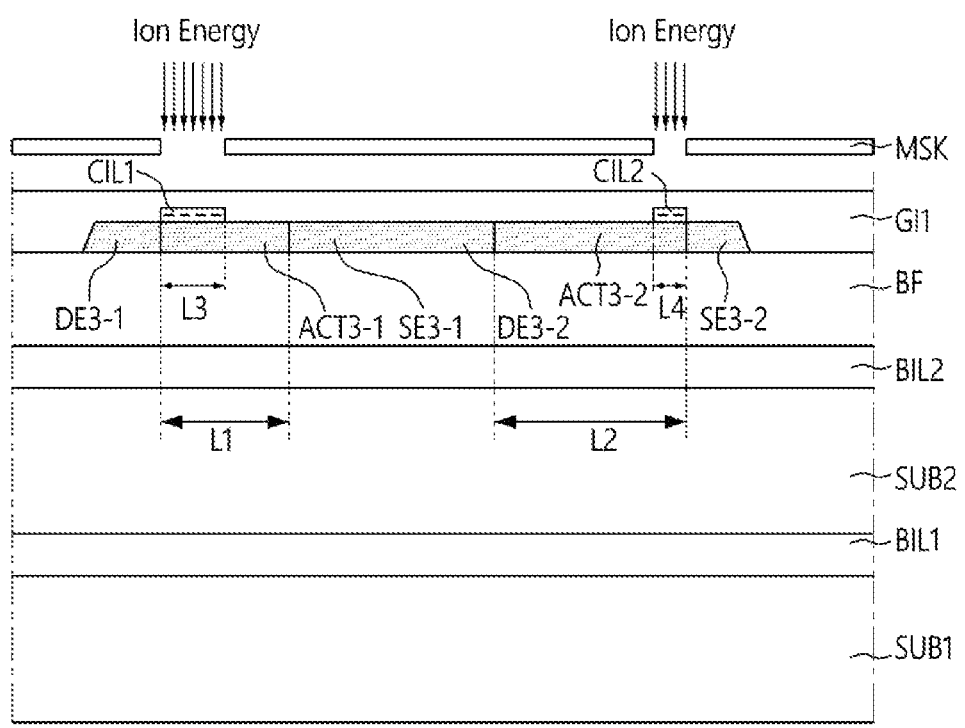
FIG. 16 is a cross-sectional view illustrating a manufacturing process of a display device according to an embodiment.

FIG. 16 is a cross-sectional view illustrating a manufacturing process of a display device according to an embodiment.

Referring to FIG. 16, the first charge injection layer CIL1 is disposed adjacent to the drain electrode DE3-1 of the first-third transistor ST3-1 on the semiconductor region ACT3-1 of the first-third transistor ST3-1. The first charge injection layer CIL1 may be formed on the semiconductor region ACT3-1 of the first-third transistor ST3-1 by doping ion energy using a hard mask MSK or a photoresist.

The second charge injection layer CIL2 may be disposed adjacent to the source electrode SE3-2 of the second-third transistor ST3-2 on the semiconductor region ACT3-2 of the second-third transistor ST3-2. The second charge injection layer CIL2 may be formed on the semiconductor region ACT3-2 of the second-third transistor ST3-2 by doping ion energy using a hard mask MSK or a photoresist.

In an embodiment of the display device 10, the first-third transistor ST3-1 may be doped with relatively stronger ion energy than the second-third transistor ST3-2. The charge injection density formed on the semiconductor region ACT3-1 of the first-third transistor ST3-1 may be greater than the charge injection density formed on the semiconductor region ACT3-2 of the second-third transistor ST3-2. The charge injection area formed on the semiconductor region ACT3-1 of the first-third transistor ST3-1 may be greater than the charge injection area formed on the semiconductor region ACT3-2 of the second-third transistor ST3-2.

The display device 10 may differentially inject charges into the first-third transistor ST3-1 and the second-third transistor ST3-2, thereby reducing the leakage current flowing in the first-third transistor ST3-1 and the second-third transistor ST3-2 and reducing the threshold voltage shift. Accordingly, the first-third transistor ST3-1 and the second-third transistor ST3-2 may have excellent leakage current characteristics. The first-third transistor ST3-1 and the second-third transistor ST3-2 may effectively prevent leakage current from flowing in the first node N1, which is the gate electrode of the first transistor ST1, and stably maintain the voltage in the pixel SP.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
    a light emitting element disposed on a substrate;
    a first transistor which controls a driving current flowing in the light emitting element;
    a second transistor which supplies a data voltage to a gate electrode of the first transistor;
    a first-third transistor and a second-third transistor connected to each other in series between the gate electrode of the first transistor and a drain electrode of the first transistor;
    a first charge injection layer disposed on a semiconductor region of the first-third transistor to be adjacent to a drain electrode of the first-third transistor electrically connected to the gate electrode of the first transistor, wherein the semiconductor region of the first-third transistor is disposed between the first charge injection layer and the substrate; and a second charge injection layer disposed on a semiconductor region of the second-third transistor to be adjacent to a source electrode of the second-third transistor integrally formed with the drain electrode of the first transistor as a single unitary and indivisible part, wherein the semiconductor region of the second-third transistor is disposed between the second charge injection layer and the substrate, wherein a charge injection area of the first charge injection layer is greater than a charge injection area of the second charge injection layer.

2. The display device of claim 1, wherein a length of the semiconductor region of the first-third transistor is shorter than a length of the semiconductor region of the second-third transistor, and wherein a length of the first charge injection layer is longer than a length of the second charge injection layer.

3. The display device of claim 1, further comprising:
a first initialization voltage line which supplies a first initialization voltage;
a first-fourth transistor and a second-fourth transistor connected to each other in series between the gate electrode of the first transistor and the first initialization voltage line;
a third charge injection layer disposed on a semiconductor region of the first-fourth transistor to be adjacent to a source electrode of the first-fourth transistor electrically connected to the gate electrode of the first transistor; and
a fourth charge injection layer disposed on a semiconductor region of the second-fourth transistor to be adjacent to a drain electrode of the second-fourth transistor electrically connected to the first initialization voltage line.

4. The display device of claim 3,
wherein a charge injection area of the third charge injection layer is greater than a charge injection area of the fourth charge injection layer.

5. The display device of claim 3,
wherein a length of the semiconductor region of the first-fourth transistor is shorter than a length of the semiconductor region of the second-fourth transistor, and
wherein a length of the third charge injection layer is longer than a length of the fourth charge injection layer.

6. The display device of claim 3, further comprising:
a driving voltage line which supplies a driving voltage;
a first capacitor including a first capacitor electrode electrically connected to the gate electrode of the first transistor and a second capacitor electrode electrically connected to the second transistor; and
a second capacitor including a third capacitor electrode electrically connected to the second capacitor electrode and a fourth capacitor electrode electrically connected to the driving voltage line.

7. The display device of claim 6, further comprising:
a capacitor electrode overlapping a source electrode of the first-third transistor and a drain electrode of the second-third transistor; and a third capacitor formed between the source electrode of the first-third transistor and the capacitor electrode.

8. The display device of claim 6, further comprising:
a capacitor electrode overlapping a drain electrode of the first-fourth transistor and a source electrode of the second-fourth transistor; and
a fourth capacitor formed between the drain electrode of the first-fourth transistor and the capacitor electrode.

9. The display device of claim 6, further comprising:
a reference voltage line which supplies a reference voltage; and
a first-fifth transistor and a second-fifth transistor connected to each other in series between the second capacitor electrode and the reference voltage line.

10. The display device of claim 9, further comprising:
a second initialization voltage line which supplies a second initialization voltage;
a bias voltage line which supplies a bias voltage;
a sixth transistor electrically connected between the drain electrode of the first transistor and a first electrode of the light emitting element;
a seventh transistor electrically connected between the first electrode of the light emitting element and the second initialization voltage line;
an eighth transistor electrically connected between the bias voltage line and a source electrode of the first transistor; and
a ninth transistor electrically connected between the driving voltage line and the source electrode of the first transistor.

11. The display device of claim 1,
wherein the semiconductor region of the second-third transistor has a trapezoidal shape.

12. The display device of claim 11,
wherein the semiconductor region of the second-third transistor comprises:
a first side extending to a first direction and having a first length;
a second side extending in parallel to the first side and having a second length greater than the first length;
a third side extending in a second direction perpendicular to the first direction between one side of the first side and one side of the second side; and
a fourth side extending in a diagonal direction between the first direction and the second direction from an opposing side of the first side to an opposing side of the second side.

13. A display device comprising:
a light emitting element disposed on a substrate;
a first transistor which controls a driving current flowing in the light emitting element;
a second transistor which supplies a data voltage to a gate electrode of the first transistor;
a first-third transistor and a second-third transistor connected to each other in series between the gate electrode of the first transistor and a drain electrode of the first transistor;
a first charge injection layer disposed on a semiconductor region of the first-third transistor to be adjacent to a drain electrode of the first-third transistor, wherein the semiconductor region of the first-third transistor is disposed between the first charge injection layer and the substrate;
a second charge injection layer disposed on a semiconductor region of the second-third transistor to be to a source electrode of the second-third transistor, wherein the semiconductor region of the second-third transistor is disposed between the second charge injection layer and the substrate;

a first initialization voltage line which supplies a first initialization voltage;

a first-fourth transistor and a second-fourth transistor connected to each other in series between the gate electrode of the first transistor and the first initialization voltage line;

a third charge injection layer disposed on a semiconductor region of the first-fourth transistor to be adjacent to a source electrode of the first-fourth transistor, wherein the semiconductor region of the first-fourth transistor is disposed between the third charge injection layer and the substrate; and a fourth charge injection layer disposed on a semiconductor region of the second-fourth transistor to be adjacent to a drain electrode of the second-fourth transistor, wherein the semiconductor region of the second-fourth transistor is disposed between the fourth charge injection layer and the substrate.

14. The display device of claim 13,
wherein a length of the semiconductor region of the first-third transistor is shorter than a length of the semiconductor region of the second-third transistor, and wherein a length of the first charge injection layer is longer than a length of the second charge injection layer.

15. The display device of claim 13,
wherein a length of the semiconductor region of the first-fourth transistor is shorter than a length of the semiconductor region of the second-fourth transistor, and wherein a length of the third charge injection layer is longer than a length of the fourth charge injection layer.

16. A display device comprising:
a light emitting element disposed on a substrate;
a first transistor which controls a driving current flowing in the light emitting element;
a second transistor which supplies a data voltage to a gate electrode of the first transistor; and
a first-third transistor and a second-third transistor connected to each other in series between the gate electrode of the first transistor and a drain electrode of the first transistor,
wherein a semiconductor region of the second-third transistor includes:
a first side extending in a first direction and having a first length;
a second side extending in parallel to the first side and having a second length greater than the first length;
a third side extending in a second direction perpendicular to the first direction between one side of the first side and one side of the second side; and a fourth side extending in a diagonal direction between the first direction and the second direction from an opposing side of the first side to an opposing side of the second side.

17. The display device of claim 16, further comprising:
a first charge injection layer adjacently disposed on a semiconductor region of the first-third transistor to be adjacent to a drain electrode of the first-third transistor electrically connected to the gate electrode of the first transistor; and a second charge injection layer disposed on a semiconductor region of the second-third transistor to be adjacent to a source electrode of the second-third transistor integrally formed with the drain electrode of the first transistor as a single unitary and indivisible part.

18. The display device of claim 17,
wherein a length of the semiconductor region of the first-third transistor is shorter than a length of the semiconductor region of the second-third transistor, and wherein a length of the first charge injection layer is longer than a length of the second charge injection layer.

19. A method of manufacturing a display device, the method comprising:
forming a semiconductor region, a source electrode, and a drain electrode of each of a first transistor, a second transistor, a first-third transistor, and a second-third transistor on a substrate;

doping a first ion energy on a portion of the semiconductor region of the first-third transistor adjacent to the drain electrode of the first-third transistor;

doping a second ion energy weaker than the first ion energy on a portion of the semiconductor region of the second-third transistor adjacent to the source electrode of the second-third transistor; and forming a gate electrode of each of the first transistor, the second transistor, the first-third transistor, and the second-third transistor, wherein the second transistor is electrically connected to the gate electrode of the first transistor, and the first-third transistor and second-third transistor are connected to each other in series between the gate electrode of the first transistor and the drain electrode of the first transistor.

20. The method of claim 19,
wherein the doping the first ion energy includes doping ion energy on the portion of the semiconductor region of the first-third transistor using a hard mask or a photoresist.

21. An electronic device comprising the display device of claim 1.

22. An electronic device comprising the display device of claim 13.

23. An electronic device comprising the display device of claim 16.

* * * * *